(12) United States Patent
Ogino et al.

(10) Patent No.: US 8,399,309 B2
(45) Date of Patent: Mar. 19, 2013

(54) SEMICONDUCTOR DEVICE MANUFACTURING METHOD

(75) Inventors: Masaaki Ogino, Matsumoto (JP); Hiroki Wakimoto, Matsumoto (JP); Masayuki Miyazaki, Shiojiri (JP)

(73) Assignee: Fuji Electric Co., Ltd. (JP)

( * ) Notice: Subject to any disclaimer, the term of this patent is extended or adjusted under 35 U.S.C. 154(b) by 127 days.

(21) Appl. No.: 13/109,660

(22) Filed: May 17, 2011

(65) Prior Publication Data

US 2011/0281406 A1 Nov. 17, 2011

(30) Foreign Application Priority Data

May 17, 2010 (JP) .................................. 2010-112829

(51) Int. Cl.
*H01L 21/00* (2006.01)
(52) U.S. Cl. ........................................ 438/138; 438/529
(58) Field of Classification Search .......... 438/133–140, 438/527–529
See application file for complete search history.

(56) References Cited

U.S. PATENT DOCUMENTS

| 5,023,191 | A | * | 6/1991 | Sakurai | ........................ | 438/527 |
| 5,034,336 | A | * | 7/1991 | Seki | .............................. | 438/138 |
| 2005/0029568 | A1 | | 2/2005 | Tokuda et al. | | |
| 2006/0038206 | A1 | | 2/2006 | Shimoyama et al. | | |

FOREIGN PATENT DOCUMENTS

| JP | 2001-185727 A | 7/2001 |
| JP | 2004-336008 A | 11/2004 |
| JP | 2005-093972 A | 4/2005 |
| JP | 2006-303410 A | 11/2006 |
| JP | 2009-177039 A | 8/2009 |
| WO | 2009139417 A1 | 11/2009 |

* cited by examiner

*Primary Examiner* — Richard A. Booth
(74) *Attorney, Agent, or Firm* — Rossi, Kimms & McDowell LLP

(57) ABSTRACT

A manufacturing method is disclosed which ensures strength of a wafer and improves device performance. A thermal diffusion layer is formed from a front surface of a wafer. A tapered groove which reaches the thermal diffusion layer is formed from a back surface by anisotropic etching with alkaline solution. In-groove thermal diffusion layer is formed on side wall surfaces of the groove. A separation layer of a reverse blocking IGBT is configured of the thermal diffusion layer and the in-groove diffusion layer. The thermal diffusion layer is formed shallowly by forming the in-groove diffusion layer. It is possible to considerably reduce thermal diffusion time. By carrying out an ion implantation forming the in-groove diffusion layer and an ion implantation forming a collector layer separately, it is possible to select an optimum value for tradeoff between turn-on voltage and switching loss, while ensuring reverse blocking voltage of the reverse blocking IGBT.

24 Claims, 19 Drawing Sheets

SEMICONDUCTOR DEVICE MANUFACTURING METHOD

BACKGROUND OF THE INVENTION

A. Field of the Invention

The present invention relates to a manufacturing method of a semiconductor device such as a reverse blocking IGBT (IGBT: insulated gate bipolar transistor). In particular, the invention relates to a manufacturing method whereby a separation layer of a reverse blocking IGBT is formed.

B. Description of the Related Art

FIGS. 18A to 18C, showing a heretofore known reverse blocking IGBT manufacturing method, are main portion manufacturing step sectional views shown in order of step. Herein, a reverse blocking IGBT with a blocking voltage of 1,200V is given as an example.

In FIG. 18A, front surface 92 of silicon wafer 91a (hereafter called simply "the wafer 91a") with a thickness in the region of 400 µm is covered with mask 95 having apertures 96. Continuing, an impurity source (for example, a boron source) is applied to mask 95, and a long-time diffusion in the region of 300 hours is carried out at a high temperature of, for example, 1,300° C. Owing to the long-time diffusion, the impurity is introduced into wafer 91a through apertures 96, and thermal diffusion layers 97 exceeding 200 µm are formed.

Next, in FIG. 18B, surface structure 98 of a planar gate type reverse blocking IGBT is constructed on front surface 92 of wafer 91a. As shown in FIG. 19, surface structure 98 is configured of p-well layer 101, n-emitter layer 102, gate insulating film 103, gate electrode 104, interlayer insulating film 105, emitter electrode 106, and surface protecting film 107 of polyimide or the like. FIG. 19 is a detailed view of an E portion of FIG. 18B. Also, surface protecting film 107 is not shown in FIG. 18B.

Next, in FIG. 18C, the top of surface structure 98 is covered with resist 99 in order to protect surface structure 98. Continuing, back surface 93a of wafer 91a is ground by in the region of 200 µm so as to reach thermal diffusion layers 97, forming a thinned wafer 91. In this way, thermal diffusion layers 97 are continuous from the front to the back, and separation layers 100 of the reverse blocking IGBT are formed.

Also, in JP-A-2001-185727 (FIG. 27), it is described that, after a p-diffusion layer is formed on the front surface and a p-collector layer is formed on the back surface, grooves are formed by a machining and a chemical process from the back surface in such a way as to come into contact with the front surface p-diffusion layer, and the p-diffusion layer is formed on the side walls of the grooves and used as a separation layer. In this case, the p-collector layer and the p-diffusion layer formed on the side walls of the grooves are formed separately.

Also, in JP-A-2006-303410 (FIG. 1) and WO-2009-139417 (FIG. 1), it is described that, after separation grooves are formed from the back surface in such a way as to come into contact with a front surface diffusion layer, a p-diffusion layer formed in the grooves and a p-collector layer formed on the back surface are formed simultaneously.

Also, in JP-A-2005-93972 (FIG. 2), after forming a p-collector layer, grooves are formed in such a way as to make contact with the p-collector layer. It is described that a p-diffusion layer is formed on the side walls of the grooves and used as a separation layer. In this case, a thin p-layer forming the collector layer and a deep p-layer formed on the side walls of the grooves are formed separately.

Also, in JP-A-2004-336008 (FIG. 1), it is described that grooves are formed after a p-collector layer is formed, an impurity is diffused from the grooves, and this diffusion layer is linked to the p-collector layer and used as a separation layer. The separation layer is formed farther to the inside of the chip than the dicing line.

Also, in JP-A-2009-177039 (FIG. 7), an ion implantation is carried out into the back surface, forming a p-collector layer, and then the wafer is diced into chips. It is described that the chips are stacked together, and an ion implantation is carried out into a side surface thereof, forming a separation layer.

With the heretofore known manufacturing method shown in FIGS. 18A to 18C, as separation layers 100 are formed only by a thermal diffusion of an impurity diffusion from front surface 92, it is difficult to form thick separation layers, and it is difficult to increase the blocking voltage of the device. As previously described, with the 1,200V class, the thickness of wafer 91 is in the region of 200 µm, and in order to form the thick separation layers 100, a long-time thermal diffusion of in the region of 300 hours at a high temperature in the region of 1,300° C. is necessary. When carrying out a long-time thermal diffusion at this kind of high temperature, oxygen enters the high resistance wafer necessary for an increase in blocking voltage. The oxygen becomes a donor, reducing the resistance, and causing a disadvantage such as a reduction in the blocking voltage of the reverse blocking IGBT.

Also, as a long time in the region of 300 hours (approximately two weeks) is necessary for one thermal process, throughput is extremely poor, leading to a reduction in productivity. Next, problems with the previously described JP-A-2001-185727 (FIG. 27), JP-A-2006-303410 (FIG. 1), WO-2009-139417 (FIG. 1), JP-A-2005-93972 (FIG. 2), JP-A-2004-336008 (FIG. 1), and JP-A-2009-177039 (FIG. 7) will be described.

In JP-A-2001-185727 (FIG. 27), as the fabrication of the grooves is carried out by a machining and a chemical process, there is no description of an anisotropic etching utilizing the crystal orientation.

In JP-A-2006-303410 (FIG. 1) and WO-2009-139417 (FIG. 1), as the p-diffusion layer of the grooves and the p-collector layer are formed simultaneously, it is not possible to optimize both the impurity concentration of the groove diffusion layer and the impurity concentration of the p-collector layer. For example, when the impurity concentration of the groove diffusion layer is optimized, the tradeoff between the turn-on voltage and switching loss deteriorates. Also, when the impurity concentration of the p-collector layer is optimized, it is difficult to ensure the blocking voltage. Also, as the grooves are formed from the back side to near the front surface, the mechanical strength of the wafer is low, and it may break when handling.

In JP-A-2005-93972 (FIG. 2), as deep grooves are formed from the front surface side reaching the p-collector layer on the back surface side, the mechanical strength of the wafer is low, and it may break when handling.

In JP-A-2004-336008 (FIG. 1), as the dicing line is on the outer side of the separation layer, the chips increase in size, and the chip cost increases.

In JP-A-2009-177039 (FIG. 7), as the chips are stacked after dicing and an ion implantation is carried out into a side surface thereof, it may happen that the surfaces of the chips are scratched, leading to a reduction in device performance.

Furthermore, in JP-A-2001-185727 (FIG. 27) to JP-A-2009-177039 (FIG. 7), there is no description to the effect that "Grooves are formed by an anisotropic etching with an alkaline solution from the back surface side in such a way as to come into contact with the thermal diffusion layers formed from the front surface side. Continuing, the thermal diffusion layers are formed on the inner walls of the grooves, and separation layers are formed from the thermal diffusion layers and in-groove diffusion layers. Furthermore, an ion implantation for forming the in-groove diffusion layers and an ion implantation for forming the back surface collector layer are carried out separately".

The present invention is directed to overcoming or at least reducing the effects of one or more of the problems set forth above.

SUMMARY OF THE INVENTION

The invention provides a semiconductor device manufacturing method whereby the heretofore described problems are solved, the wafer strength is ensured, the device performance can be improved, and it is possible to reduce the thermal diffusion time when forming the thermal diffusion layers configuring the separation layers.

According to a first aspect of the invention, a semiconductor device manufacturing method includes a step of, in a first conductivity type silicon wafer wherein the plane orientation of a first main surface is the (100) plane, using a first mask opened to an equal width on either side of a first central line in places which are to be <110> direction dicing lines, forming a second conductivity type thermal diffusion layer from the first main surface side toward the inside of the silicon wafer, a step of reducing the thickness of the silicon wafer from a second main surface side, a step of forming a second mask opened in such a way as to have an equal width on either side of a second central line, which is a projection of the first central line on a second main surface of the silicon wafer reduced in thickness, on the second main surface, a step of forming a groove reaching the thermal diffusion layer from the second main surface, using the second mask, by an anisotropic etching with an alkaline solution, a step of carrying out a first ion implantation with a second conductivity type impurity into side wall surfaces of the groove using the second mask, a step of removing the second mask, and carrying out a second ion implantation with the second conductivity type impurity into the second main surface and the side wall surfaces of the groove, and a step of carrying out an annealing process for activating the impurity introduced by the first ion implantation and second ion implantation, and forming an in-groove diffusion layer and a collector layer.

Also, according to a second aspect of the invention, a semiconductor device manufacturing method includes a step of, in a first conductivity type silicon wafer wherein the plane orientation of a first main surface is the (100) plane, using a first mask opened to an equal width on either side of a first central line in places which are to be <110> direction dicing lines, forming a second conductivity type thermal diffusion layer from the first main surface side toward the inside of the silicon wafer, a step of reducing the thickness of the silicon wafer from a second main surface side, a step of carrying out a first ion implantation with a second conductivity type impurity into the second main surface of the silicon wafer reduced in thickness, a step of forming a second mask opened in such a way as to have an equal width on either side of a second central line, which is a projection of the first central line on the second main surface, on the second main surface, a step of forming a groove reaching the thermal diffusion layer from the second main surface, using the second mask, by an anisotropic etching with an alkaline solution, a step of carrying out a second ion implantation with the second conductivity type impurity into side wall surfaces of the groove using the second mask, and a step of carrying out an annealing process for activating the impurity introduced by the first ion implantation and second ion implantation, and forming an in-groove diffusion layer and a collector layer.

Also, according to a third aspect of the invention, a semiconductor device manufacturing method includes a step of, in a first conductivity type silicon wafer wherein the plane orientation of a first main surface is the (100) plane, using a first mask opened to an equal width on either side of a first central line in places which are to be <100> direction dicing lines, forming a second conductivity type thermal diffusion layer from the first main surface side toward the inside of the silicon wafer, a step of reducing the thickness of the silicon wafer from a second main surface side, a step of projecting the first central line onto a second main surface of the silicon wafer reduced in thickness, and forming a second mask opened in such a way as to have an equal width on either side of a projected second central line on the second main surface, a step of forming a groove reaching the thermal diffusion layer from the second main surface, using the second mask, by an anisotropic etching with an alkaline solution, a step of carrying out a first ion implantation with a second conductivity type impurity into side wall surfaces of the groove using the second mask, a step of removing the second mask, and carrying out a second ion implantation with the second conductivity type impurity into the second main surface and the side wall surfaces of the groove, and a step of carrying out an annealing process for activating the impurity introduced by the first ion implantation and second ion implantation, and forming an in-groove diffusion layer and a collector layer.

Also, according to a fourth aspect of the invention, a semiconductor device manufacturing method includes a step of, in a first conductivity type silicon wafer wherein the plane orientation of a first main surface is the (100) plane, using a first mask opened to an equal width on either side of a first central line in places which are to be <100> direction dicing lines, forming a second conductivity type thermal diffusion layer from the first main surface side toward the inside of the silicon wafer, a step of reducing the thickness of the silicon wafer from a second main surface side, a step of carrying out a first ion implantation with a second conductivity type impurity into the second main surface of the silicon wafer reduced in thickness, a step of forming a second mask opened in such a way as to have an equal width on either side of a second central line, which is a projection of the first central line on the second main surface, on the second main surface, a step of forming a groove reaching the thermal diffusion layer from the second main surface, using the second mask, by an anisotropic etching with an alkaline solution, a step of carrying out a second ion implantation with the second conductivity type impurity into side wall surfaces of the groove using the second mask, and a step of carrying out an annealing process for activating the impurity introduced by the first ion implantation and second ion implantation, and forming an in-groove diffusion layer and a collector layer.

Also, according to a fifth aspect of the invention, in the first or second aspect of the invention the semiconductor device manufacturing method includes a step of, after forming the thermal diffusion layer, forming a second conductivity type well layer in a front side surface layer of a first conductivity type silicon substrate which is one portion of the silicon wafer surrounded by the places which are to be the dicing lines, a step of forming a first conductivity type emitter layer on a surface layer of the well layer, a step of forming a gate electrode across a gate insulating film over the well layer sandwiched between the silicon substrate and the emitter layer, a step of forming an interlayer insulating film across the top of the gate electrode and the top of the emitter layer, a step of forming an emitter electrode electrically connected to the emitter layer and well layer on the interlayer insulating film, a step of, after a surface structure is formed by a step including a step of forming a surface protecting film on the emitter electrode, forming the in-groove diffusion layer and the collector layer on a back surface of the silicon substrate, a step of forming a collector electrode across the top of the in-groove diffusion layer and the top of the collector layer, and a step of cutting and singulating the thermal diffusion layer along the places which are the dicing lines.

Also, according to a sixth aspect of the invention, in the third or fourth aspect of the invention the semiconductor device manufacturing method includes a step of, after forming the thermal diffusion layer, forming a second conductivity type well layer in a front side surface layer of a first conductivity type silicon substrate which is one portion of the silicon wafer surrounded by the places which are to be the dicing lines, a step of forming a trench from the front side of the silicon substrate penetrating the well layer and having an aperture whose longitudinal direction is parallel to the direction of the places which are to be the dicing lines, a step of forming a first conductivity type emitter layer in contact with side walls of the trench on the surface layer of the well layer, a step of forming a gate insulating film on inner walls of the trench, then forming a gate electrode in such a way as to fill the inside of the trench, a step of forming an interlayer insulating film across the top of the gate electrode and the top of the emitter layer, a step of forming an emitter electrode electrically connected to the emitter layer and well layer on the interlayer insulating film, a step of, after a surface structure is formed by a step including a step of forming a surface protecting film on the emitter electrode, forming the in-groove diffusion layer and the collector layer on a back surface of the silicon substrate, a step of forming a collector electrode across the top of the in-groove diffusion layer and the top of the collector layer, and a step of cutting and singulating the thermal diffusion layer along the places which are the dicing lines.

Also, according to a seventh aspect of the invention, in the first or third aspect of the invention it is preferable that the accelerating voltage and dose of the first ion implantation are each larger than the accelerating voltage and dose of the second ion implantation.

Also, according to an eighth aspect of the invention, in the second or fourth aspect of the invention it is preferable that the accelerating voltage and dose of the second ion implantation are each larger than the accelerating voltage and dose of the first ion implantation.

Also, according to a ninth aspect of the invention, in the first aspect of the invention it is preferable that the first ion implantation is carried out with boron with an accelerating voltage of 60 keV to 180 keV and a dose of $5\times10^{13}$ cm$^{-2}$ to $5\times10^{15}$ cm$^{-2}$, and the second ion implantation is carried out with boron with an accelerating voltage of 40 keV to 150 keV and a dose of $1\times10^{13}$ cm$^{-2}$ to $1\times10^{15}$ cm$^{-2}$.

Also, according to a tenth aspect of the invention, in the second aspect of the invention it is preferable that the second ion implantation is carried out with boron with an accelerating voltage of 60 keV to 180 keV and a dose of $5\times10^{13}$ cm$^{-2}$ to $5\times10^{15}$ cm$^{-2}$, and the first ion implantation is carried out with boron with an accelerating voltage of 40 keV to 150 keV and a dose of $1\times10^{13}$ cm$^{-2}$ to $1\times10^{15}$ cm$^{-2}$.

Also, according to an eleventh aspect of the invention, in the third aspect of the invention it is preferable that the first ion implantation is carried out with boron with an accelerating voltage of 80 keV to 200 keV and a dose of $5\times10^{13}$ cm$^{-2}$ to $5\times10^{15}$ cm$^{-2}$, and the second ion implantation is carried out with boron with an accelerating voltage of 40 keV to 150 keV and a dose of $1\times10^{13}$ cm$^{-2}$ to $1\times10^{15}$ cm$^{-2}$.

Also, according to a twelfth aspect of the invention, in the fourth aspect of the invention it is preferable that the second ion implantation is carried out with boron with an accelerating voltage of 80 keV to 200 keV and a dose of $5\times10^{13}$ cm$^{-2}$ to $5\times10^{15}$ cm$^{-2}$, and the first ion implantation is carried out with boron with an accelerating voltage of 40 keV to 150 keV and a dose of $1\times10^{13}$ cm$^{-2}$ to $1\times10^{15}$ cm$^{-2}$.

Also, according to a thirteenth aspect of the invention, in the first to fourth aspects of the invention it is preferable that the annealing process is a laser annealing or a furnace annealing.

Also, according to a fourteenth aspect of the invention, in the first or third aspect of the invention it is preferable that the first ion implantation implants ions diagonally.

Also, according to a fifteenth aspect of the invention, in the second or fourth aspect of the invention it is preferable that the second ion implantation implants ions diagonally.

Also, according to a sixteenth aspect of the invention, in any one of the first to fourth aspects of the invention it is preferable that a separation layer is configured of the thermal diffusion layer and the in-groove diffusion layer.

Also, according to a seventeenth aspect of the invention, in the first, third, seventh, ninth, eleventh aspect of the invention it is preferable that in the step of forming the groove by an anisotropic etching with an alkaline solution, etching is done in such a way that the aperture width of the groove is greater than the aperture width of the second mask.

According to the invention, by connecting the thermal diffusion layer formed from the front surface and the in-groove diffusion layer formed from the back surface, thus forming the separation layer, it is possible to form the thermal diffusion layer shallowly, and it is possible to considerably reduce the thermal diffusion time.

Also, by carrying out the ion implantation forming the in-groove diffusion layer and the ion implantation forming the collector layer separately, it is possible to select an optimum value for the tradeoff between the turn-on voltage and switching loss, while ensuring the reverse blocking voltage.

Also, by selecting <100> directions for the dicing lines, and arranging in such a way that the peripheral ends of the chips face in the <100> directions, it is possible to make the trench side wall surfaces configuring the trench gate the (100) plane, which has few interface states. By forming a channel in the (100) plane, it is possible to increase the electron mobility. As a result of this, it is possible to increase the performance of the IGBT.

Also, by making the direction of the grooves formed from the back surface of the wafer a <100> direction, they intersect with the cleavage direction at 45°. For this reason, a cleavage is unlikely to occur, and it is possible to increase the mechanical strength of the wafer. As a result of this, it is possible to reduce wafer breakage and chipping when handling in-process, and it is possible to improve the yield rate.

BRIEF DESCRIPTION OF THE DRAWINGS

The foregoing advantages and features of the invention will become apparent upon reference to the following detailed description and the accompanying drawings, of which:

FIGS. 5A to 5C are diagrams illustrating a wafer of the first working example, wherein FIG. 5A is a plan view of a wafer of FIG. 1A, FIG. 5B is a sectional view of FIG. 5A, and FIG. 5C is an enlarged view of an A portion of FIG. 5B;

FIGS. 6A and 6B are illustrations of a surface structure 8 and a blocking voltage structure, wherein FIG. 6A is a sectional view of the surface structure, and FIG. 6B is a sectional view of the blocking voltage structure. FIG. 6A is a detailed view of a B portion of FIG. 1C;

FIGS. 14A to 14C are diagrams illustrating a wafer of the third working example, wherein FIG. 14A is a plan view of a wafer of FIG. 10A, FIG. 14B is a sectional view of FIG. 14A, and FIG. 14C is an enlarged view of a C portion of FIG. 14B;

FIGS. 15A to 15C are illustrations of a surface structure 58, a blocking voltage structure, and a trench 88, wherein FIG. 15A is a sectional view of the surface structure, FIG. 15B is a sectional view of the blocking voltage structure, and FIG. 15C is a perspective view of the trench;

DETAILED DESCRIPTION OF SPECIFIC EMBODIMENTS

An embodiment of the invention will be described with the following working examples.

Working Example 1

FIGS. 1A to 4J, showing a semiconductor device manufacturing method of a first working example of the invention, are main portion manufacturing step sectional views shown in order of step. This is an example of a reverse blocking IGBT having a planar gate structure.

Figure 1A:
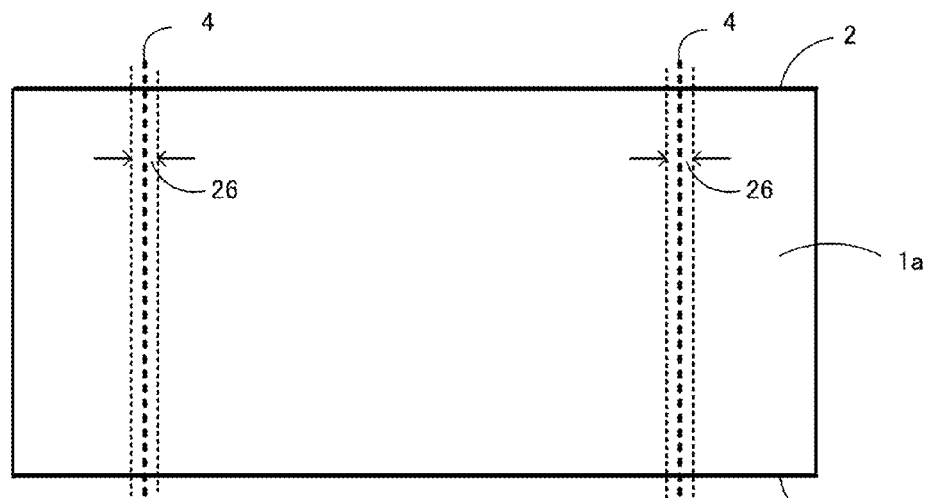
FIGS. 1A to 1C are main portion manufacturing step sectional views of a semiconductor device of a first working example of the invention.
Figure 5A:
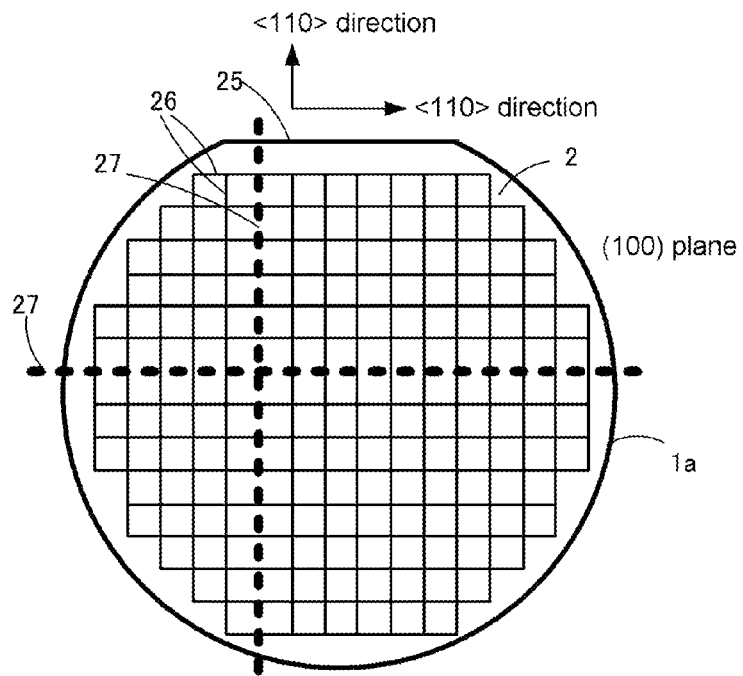
Figure 5B:
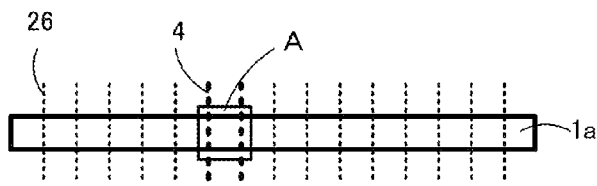
Figure 5C:
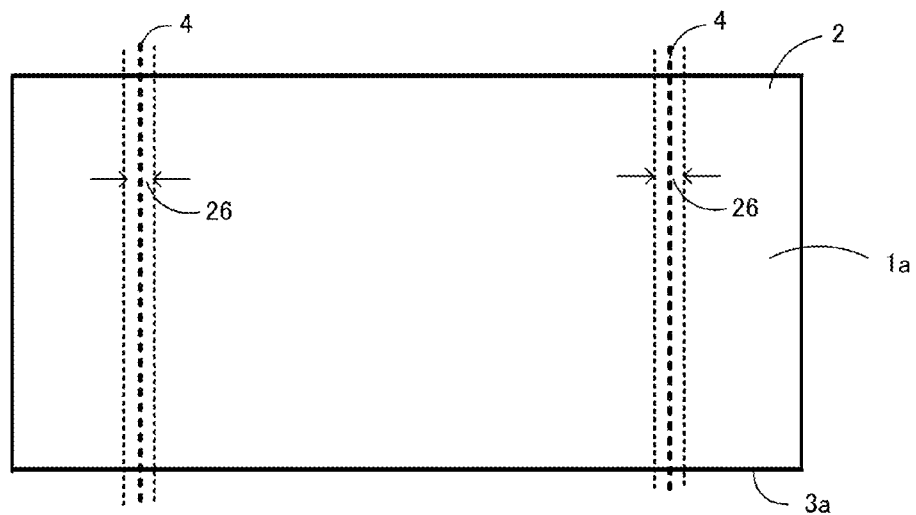

Firstly, in FIG. 1A, wafer 1a with a thickness in the region of, for example, 400 μm, wherein the directions of orientation flat (OF) 25 in the (100) plane are <110> directions, is prepared, as shown in FIGS. 5A to 5C. As the directions of OF 25 coincide with the directions of dicing lines 26 when chips are removed from wafer 1a, the directions of dicing lines 26 are also the <110> directions.

FIG. 5A is a plan view of the wafer of FIG. 1A, FIG. 5B is a sectional view of FIG. 5A, and FIG. 5C is an enlarged view of an A portion of FIG. 5B. Also, the series of step sectional views are sectional views corresponding to FIG. 5C.

Figure 1B:
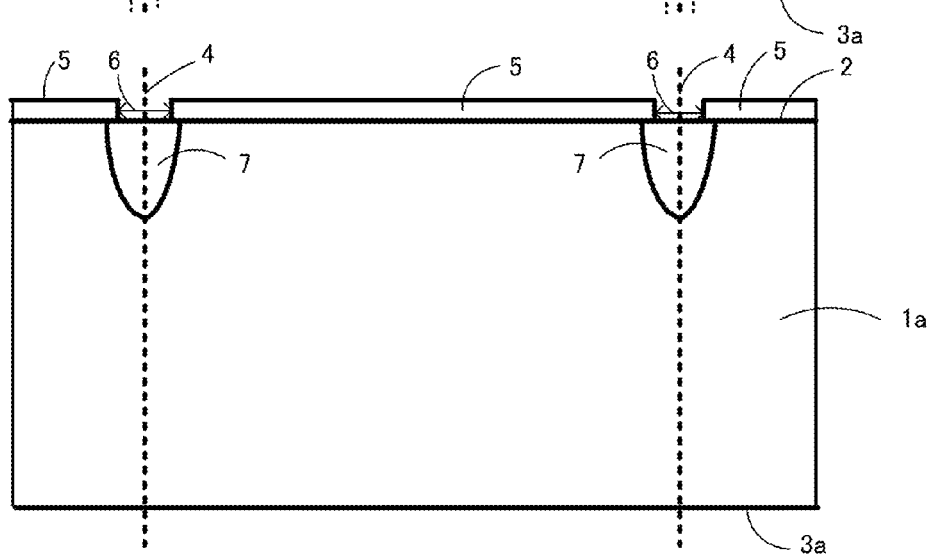

Next, in FIG. 1B, using mask 5 on which is formed a pattern having apertures 6 in places which are to be the dicing lines 26, boron ions are implanted through apertures 6 of mask 5. Subsequently, the boron is thermally diffused to a depth in the region of, for example, 85 μm, forming thermal diffusion layers 7 that become one portion of separation layers 30. The depth of the thermal diffusion layers 7 is an example when blocking voltage is 1,200V, but the depth changes according to the device blocking voltage. Apertures 6 are formed in such a way that central lines 4 of dicing lines 26 are central lines 4 of apertures 6. By so doing, apertures 6 are formed to an equal width on either side of central lines 4. The diffusion depth of the boron is equal to or greater than the thickness (wafer thickness) of silicon in a residual film when forming grooves with an alkaline etching in a subsequent step. The thickness of residual film that can be handled is 50 μm or more in a wafer of a size of 6 inches or more. For this reason, the diffusion depth of the boron is 50 μm or more.

Also, for example, a thermal oxide film, an oxide film formed using a chemical vapor deposition (CVD) method, or a resist, is used as mask 5 when implanting the ions.

Figure 1C:
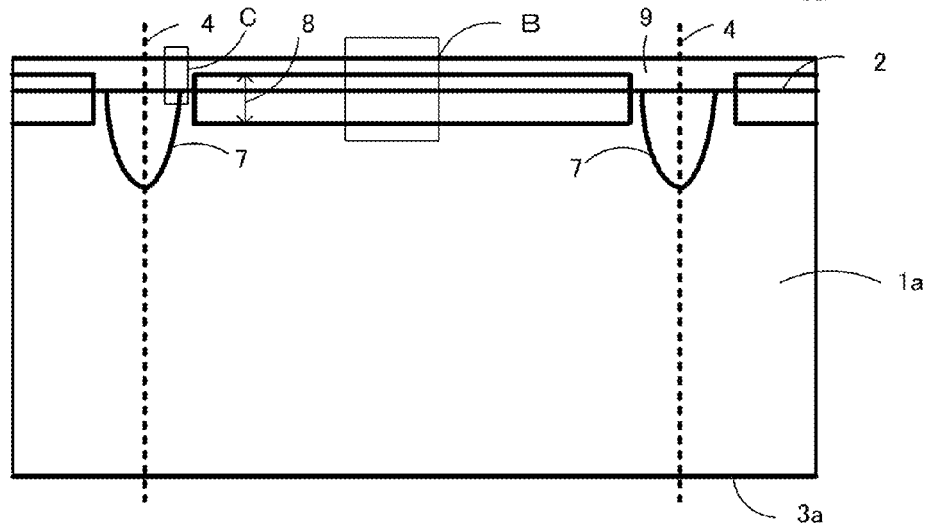
Figure 6A:
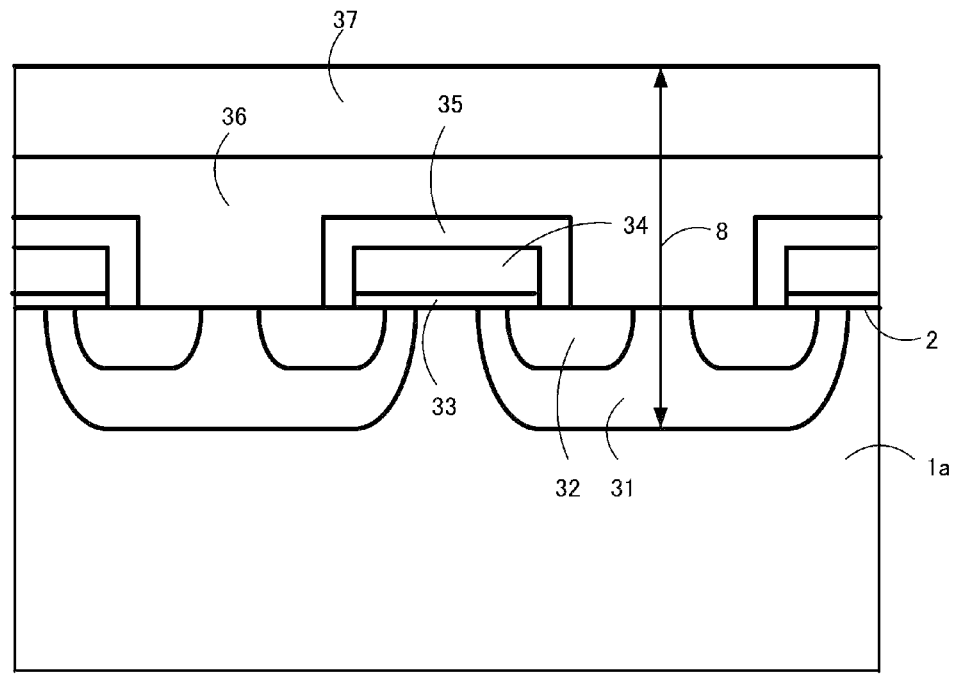
Figure 6B:
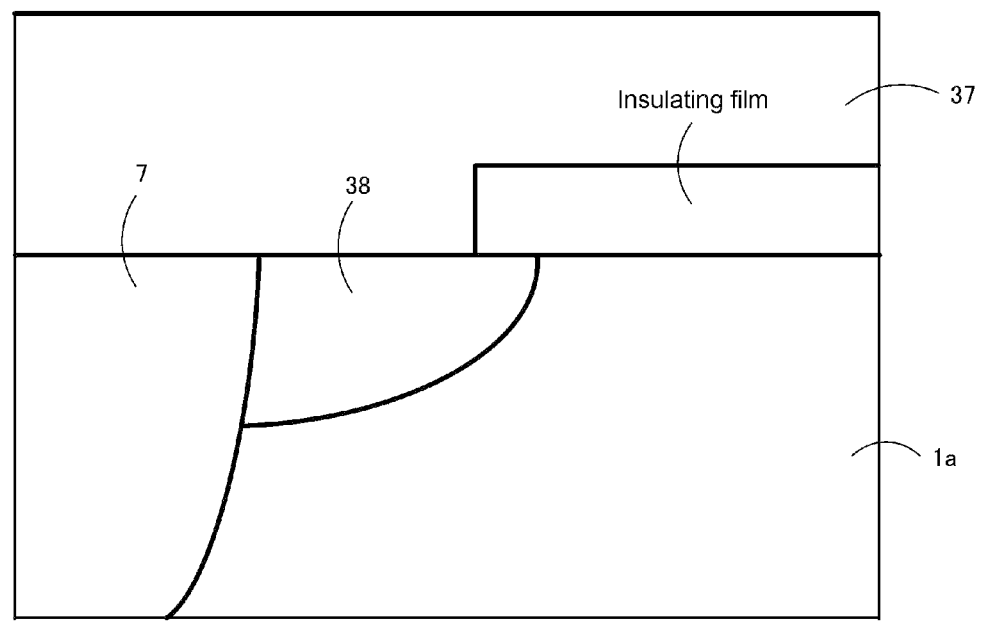

Next, in FIG. 1C, mask 5 is removed and, after planar gate type reverse blocking IGBT surface structure 8 is formed on front surface 2 of wafer 1a, resist 9 (for example, a negative resist) is applied on surface structure 8. As shown in FIGS. 6A and 6B, surface structure 8 is configured of p-well layer 31, n-emitter layer 32, gate insulating film 33, gate electrode 34, interlayer insulating film 35, emitter electrode 36, and surface protecting film 37 of polyimide or the like. Also, diffusion layer 38 configures one portion of a blocking voltage structure. FIG. 6A is a detailed view of a B portion of FIG. 1C, and FIG. 6B is a detailed view of a C portion of FIG. 1C. Also, surface protecting film 37 and diffusion layer 38 are not shown in FIG. 1C.

Figure 2D:
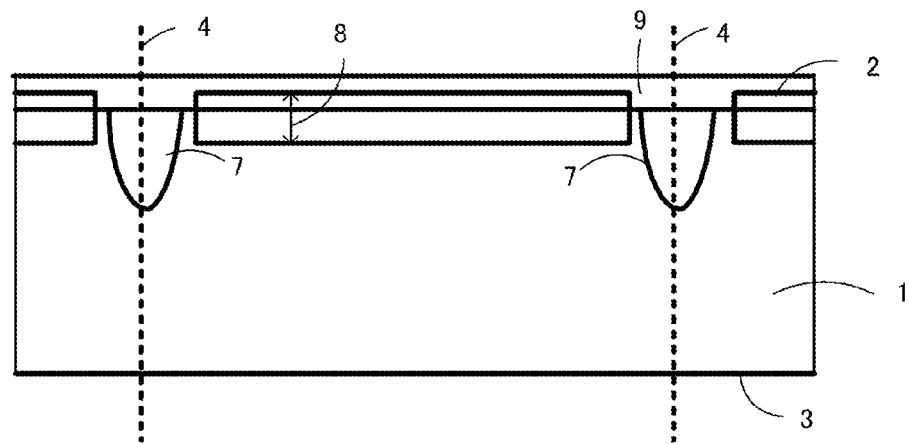
FIGS. 2D to 2F, continuing from FIGS. 1A to 1C, are main portion manufacturing step sectional views of the semiconductor device of the first working example.

Next, in FIG. 2D, the thickness of wafer 1a is reduced (the wafer is thinned) by grinding back surface 3a of the wafer 1a and etching it with a mixed acid, completing a wafer 1 with smooth back surface 3. By etching with the mixed acid after the back grinding, processing strain of the back surface 3 occurring during the back grinding is removed. Also, as the reverse blocking IGBT is a non-punch through (NPT) type IGBT, the thickness of wafer 1 is approximately 200 μm, whereby it is possible to respond to a blocking voltage of, for example, 1,200V. Of course, in the event that the device blocking voltage differs, the thickness changes.

Figure 2E:
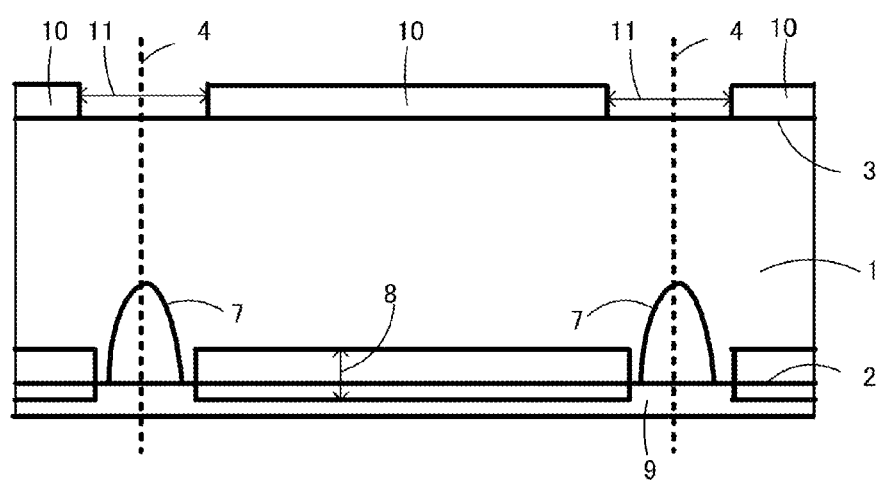

Next, in FIG. 2E, a resist is applied with the back surface 3 of the wafer 1 facing upward. Continuing, using a double-sided exposure device, the pattern (apertures 6 of the mask 5) of front surface 2 in which are formed thermal diffusion layers 7 is transferred to back surface 3 in such a way that the patterns are aligned. The pattern transferred to the back surface 3 is a pattern that is a projection of the pattern of front surface 2. The resist is patterned with the projected pattern of back surface 3, forming mask 10 in which are formed apertures 11. Central lines 4 of apertures 6 for forming thermal diffusion layers 7 and central lines 4 of apertures 11 formed in back surface 3 coincide. Apertures 11 are formed to an equal width on either side of central lines 4. Also, central lines 4 of apertures 6 forming thermal diffusion layers 7 and central lines 4 of dicing lines 26 coincide. That is, central lines 4 shown in the drawings are the central lines of each of dicing lines 26, apertures 6, and apertures 11.

Figure 2F:
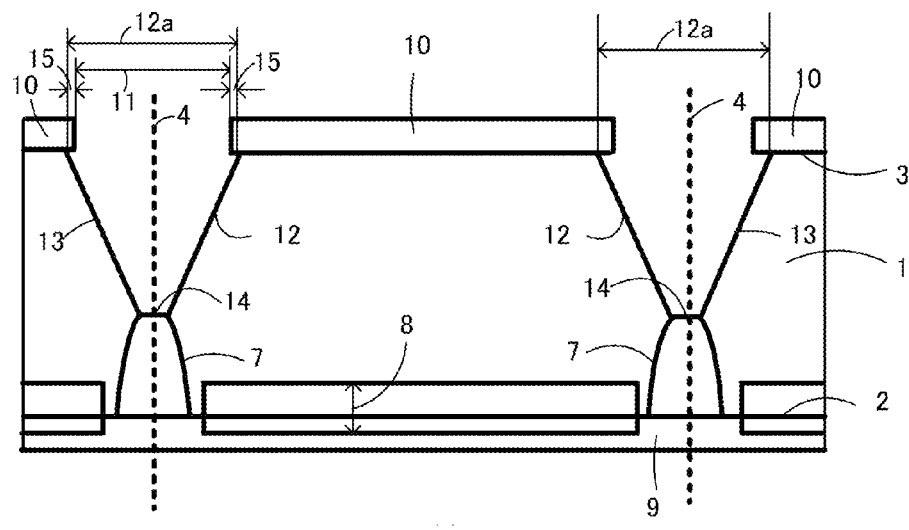
Figure 7:
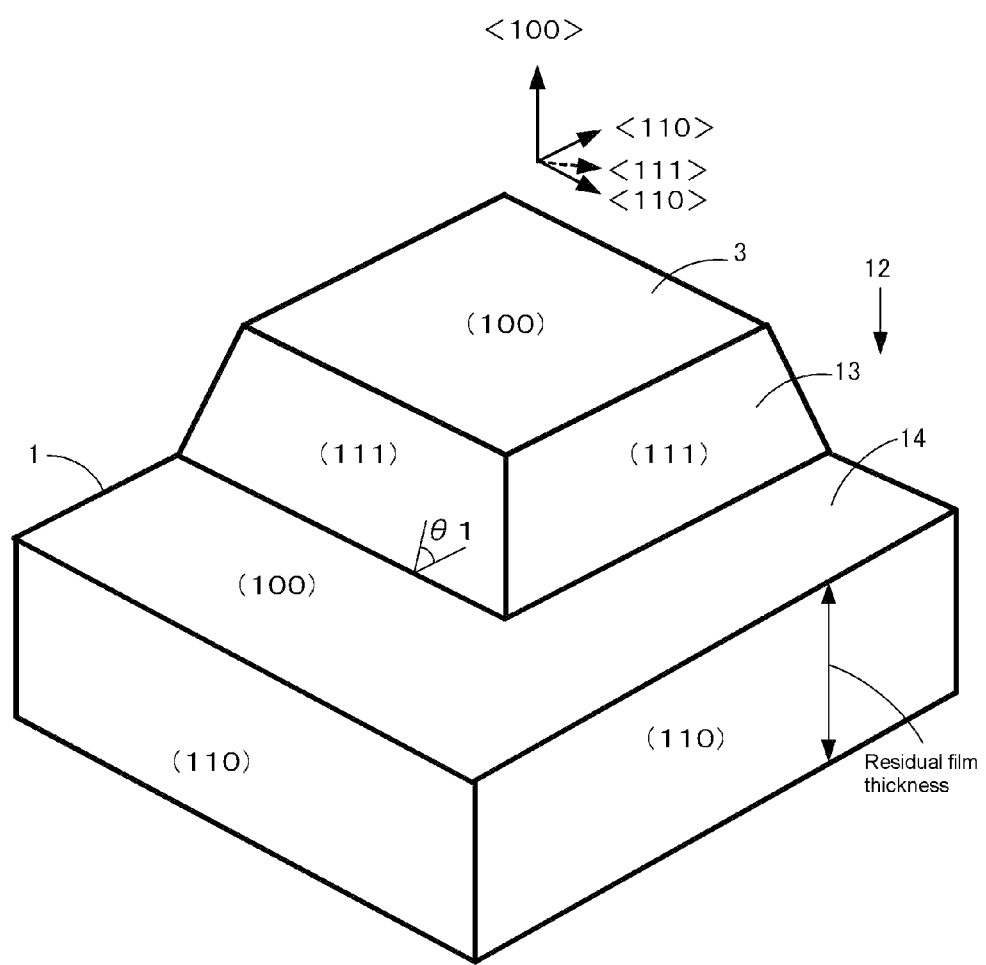
FIG. 7 is a main portion perspective view of a wafer 1 in which is formed a tapered groove 12.

Next, in FIG. 2F, using mask 10, an anisotropic etching is carried out with an alkaline solution, forming tapered grooves 12 in back surface 3 of wafer 1. For example, a 10% TMAH aqueous solution (TMAH: tetramethylammonium hydroxide) is used as the alkaline etching solution. Also, the solution temperature when etching is in the region of 85° C. With the alkaline etching, grooves 12 (V grooves) having tapered side wall surfaces 13 are formed with the (111) plane as an etch stop plane. A taper angle θ1 (indicating the obtuse angle at the places where wafer 1 surface and side wall surfaces 13 meet) of side wall surfaces 13 of tapered grooves 12 is 54.7°. Also, aperture widths 12a of grooves 12 are greater than the widths of apertures 11 of mask 10 due to side etching. For this reason, overhang 15 of mask 10 forms over aperture widths 12a of grooves 12. A negative resist is used for mask 5 so that there is no alkaline etching of surface structure 8 of front surface 2 of wafer 1 where no groove 12 is to be etched. By using the negative resist, the surface structure 8 formed on the wafer 1 is protected. FIG. 7 is a perspective view of a main portion of wafer 1 in which tapered grooves 12 are formed. The side wall surfaces 13 of grooves 12 are largely flat surfaces. Also, ridges where side wall surfaces 13 intersect are actually multifaceted with a small area, and the plane direction thereof is a plane other than (111). Herein, however, the plane directions of side wall surfaces 13 are all depicted as (111).

Figure 3G:
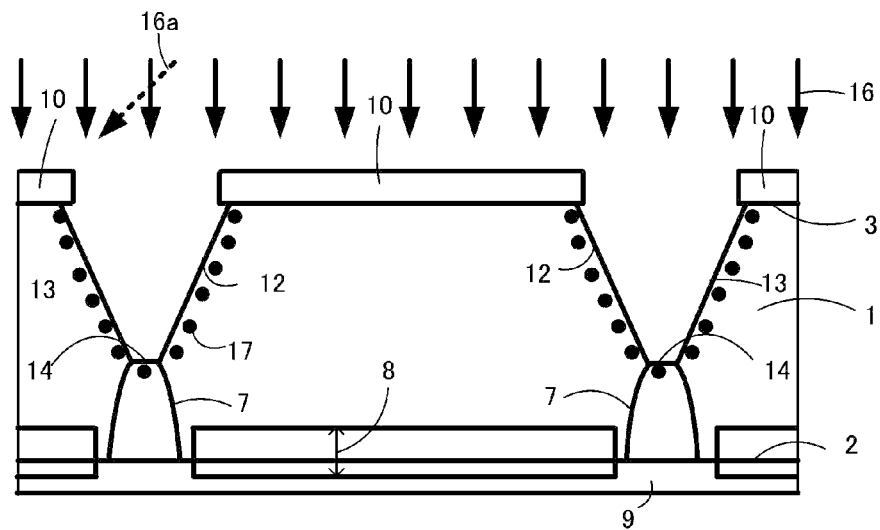
FIGS. 3G to 3I, continuing from FIGS. 2D to 2F, are main portion manufacturing step sectional views of the semiconductor device of the first working example.

Next, in FIG. 3G, ion implantation 16 of boron 17 is carried out with an accelerating voltage of 120 keV and a dose of $5 \times 10^{14}$ cm$^{-2}$ into the inner wall surfaces (side wall surfaces 13 and bottom surfaces 14) of grooves 12 using mask 10. Ion implantation 16 is carried out perpendicularly with respect to back surface 3. However, when carrying out an ion implantation diagonally with respect to back surface 3, the direction of the ion implantation with respect to the side wall surfaces of the grooves nears a perpendicular direction, and it is possible to control the range of the ion implantation, meaning that defect recovery in a subsequent annealing step is easy. As conditions for ion implantation 16, ranges of 60 keV to 180 keV for the accelerating voltage and $5 \times 10^{13}$ cm$^{-2}$ to $5 \times 10^{15}$ cm$^{-2}$ for the dose are best.

With an accelerating voltage of less than 60 keV, the implantation is too shallow. Meanwhile, when the accelerating voltage exceeds 180 keV, the damage suffered by side wall surfaces 13 of grooves 12 is large, and it is difficult for the crystallinity to recover in an annealing process. Also, with a dose of less than $5 \times 10^{13}$ cm$^{-2}$, the impurity concentration of in-groove diffusion layers 21 formed in side wall surfaces 13 of grooves 12 is too low, and it is difficult to ensure blocking voltage. Meanwhile, when the dose exceeds $5 \times 10^{15}$ cm$^{-2}$, the ion implantation time increases, and it is difficult for the crystallinity to recover in the annealing process due to the surface implanted becoming rough, meaning that the reverse leakage current increases. Consequently, it is advisable from the point of view of the device blocking voltage that the optimum values of the accelerating voltage and dose are fixed within the aforementioned ranges.

Figure 8:
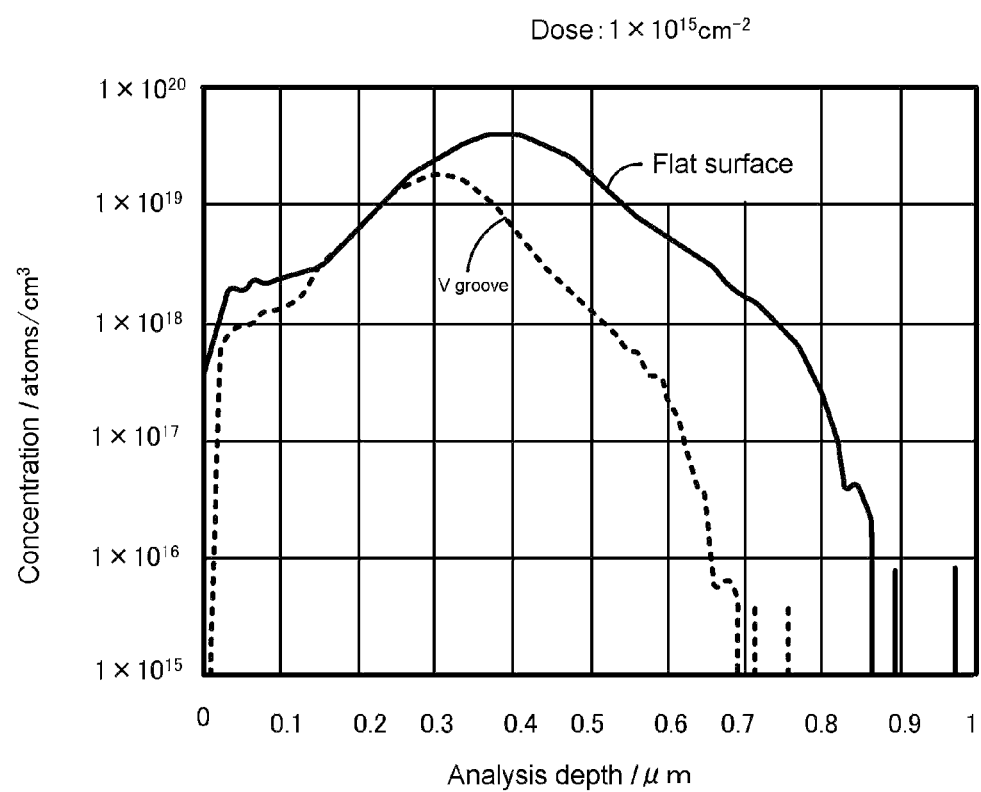
FIG. 8 is a profile diagram after ion implanted boron is activated by laser annealing.

As everything except grooves 12 is covered by mask 10, it is possible to selectively carry out ion implantation 16 in grooves 12 only. As shown in FIG. 8, the dose and implantation depth of boron 17 implanted in side wall surfaces 13 of tapered grooves 12 (V grooves) are each reduced in comparison with those of the boron implanted into a flat surface perpendicular to the ion implantation direction. FIG. 8 is a profile diagram after ion implanted boron is activated by laser annealing. The profile is obtained by measuring using SIMS after implanting $1 \times 10^{15}$ cm$^{-2}$ of boron ions and activating by laser annealing. With the flat surface, the peak concentration is $4 \times 10^{19}$ cm$^{-3}$ at a depth of approximately 0.4 μm from the surface, and a junction depth Xj is approximately 0.85 μm. Meanwhile, with the V groove, the peak concentration being $1 \times 10^{19}$ cm$^{-3}$ at a depth of approximately 0.3 μm from the surface and the junction depth Xj being approximately 0.7 μm, each value is smaller than with the flat surface. However, there is a sufficient dose and depth to form separation layers 30 of the reverse blocking IGBT in the case of the V groove too. In this way, it is possible to ensure a sufficient impurity concentration in tapered grooves 12 also.

Figure 3H:
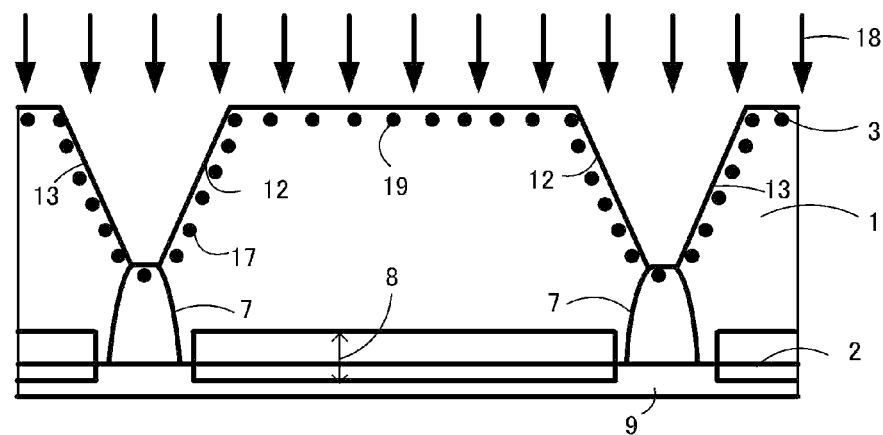

Next, in FIG. 3H, after ashing and removing mask 10, and cleaning back surface 3 of wafer 1, ion implantation 18 of boron 19 is carried out with an accelerating voltage of 80 keV and a dose of $1 \times 10^{14}$ cm$^{-2}$ over the whole of the back surface 3 of wafer 1 in order to form IGBT collector layer 22. Ion implantation 18 is carried out at a tilt angle of 7° with respect to back surface 3. As conditions for ion implantation 18, ranges of 40 keV to 150 keV for the accelerating voltage and $1 \times 10^{13}$ cm$^{-2}$ to $1 \times 10^{15}$ cm$^{-2}$ for the dose are best. With an accelerating voltage of less than 40 keV, the implantation is too shallow. Meanwhile, when the accelerating voltage exceeds 150 keV, the damage to the surface implanted is large, and it may happen that it does not recover by annealing. Also, with a dose of less than $1 \times 10^{13}$ cm$^{-2}$, the implantation of holes from collector layer 22 to drift layer 24 is reduced, and the turn-on voltage increases. Meanwhile, when the dose exceeds $1 \times 10^{15}$ cm$^{-2}$, the implantation of holes increases, and the switching loss increases. As a result of this, the tradeoff between the turn-on voltage and switching loss deteriorates when the aforementioned ranges are departed from. Consequently, it is advisable from the point of view of the tradeoff between the turn-on voltage and switching loss of the device that the optimum values of the accelerating voltage and dose are fixed within the aforementioned ranges.

Ion implantation 18 for forming collector layer 22 is also carried out at the same time into side wall surfaces 13 of grooves 12. However, the dose when previously carrying out ion implantation 16 using mask 10 is dominant.

Figure 3I:
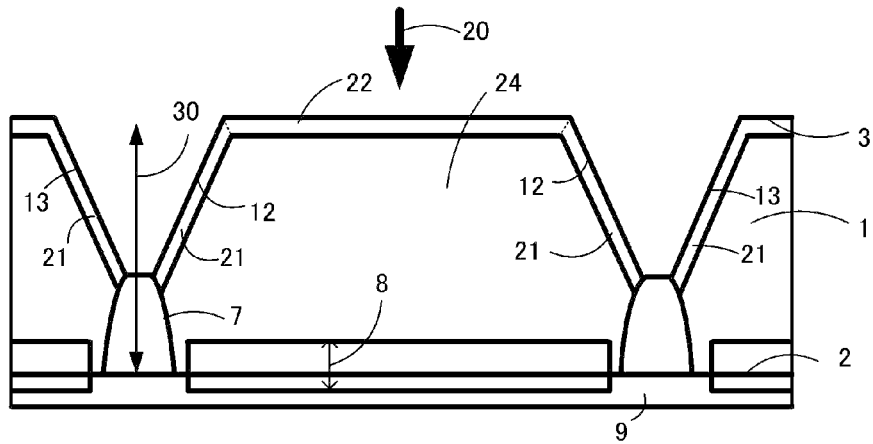

Next, in FIG. 3I, an annealing process is carried out in order to activate boron 17 and 19 implanted by ion implantations 16 and 18. The annealing process is carried out using laser annealing 20 wherein back surface 3 of wafer 1 is scanned and irradiated with a laser beam. Owing to laser annealing 20, boron 17 and 19 are activated, and in-groove diffusion layers 21 and collector layer 22 are formed. An annealing process in a furnace (an unshown furnace annealing) may be carried out in place of laser annealing 20. The annealing step also has the effect of causing crystal defects caused by the ion implantation to recover. As a condition of laser annealing 20 at this point, a laser power selected is such that boron 17 and 19 are activated, and the crystal defects caused by ion implantations 16 and 18 can recover sufficiently. Also, with the unshown furnace annealing, as a metal electrode (emitter electrode 36) is already formed on the surface of the IGBT, it is sufficient to choose a condition whereby boron 17 and 19 are activated at, for example, 400° C. or less.

Figure 4:
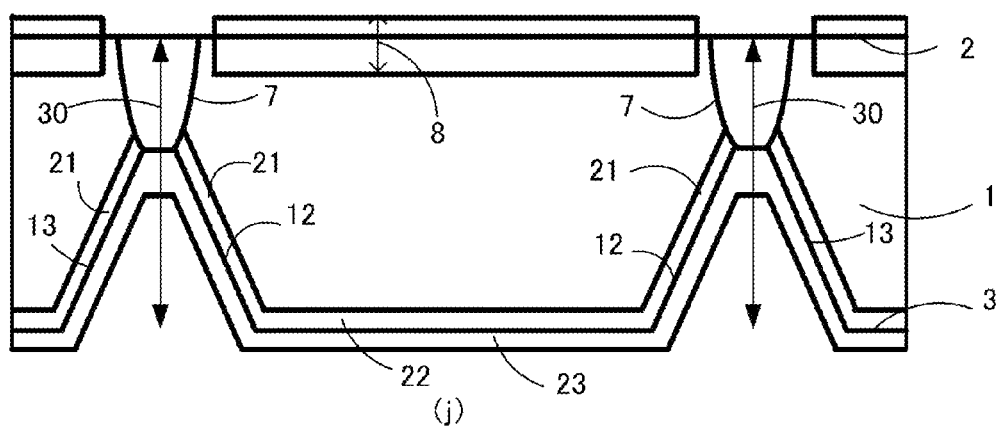
FIG. 4, continuing from FIGS. 3G to 3I, is a main portion manufacturing step sectional view of the semiconductor device of the first working example.

Next, in FIG. 4, resist 9 (the negative resist) of front surface 2 is removed using a stripping liquid. However, in the case of a furnace annealing, the resist is removed using a stripping liquid after ion implantation 18. Continuing, back surface 3 of wafer 1 is HF (hydrofluoric acid) cleaned, a natural oxide film is removed, and back surface electrode 23 (a collector electrode) is formed by sputtering. Subsequently, a metal annealing is carried out, the wafer 1 is cut from the front surface side along dicing lines 26 located in separation layers 30, dividing wafer 1, and the reverse blocking IGBT is completed. FIG. 4 is drawn with surface structure 8 facing upward. Separation layers 30 are configured of thermal diffusion layers 7 formed by thermal diffusion from front surface 2 and in-groove diffusion layers 21 formed in side wall surfaces 13 of grooves 12 from back surface 3.

As heretofore described, when forming separation layers 30 of the reverse blocking IGBT, grooves 12 are etched using mask 10 from back surface 3 side of wafer 1. Continuing, ion implantation 16 of boron 17 for forming high density in-groove diffusion layers 21 in side wall surfaces 13 of grooves 12 is carried out using mask 10. Subsequently, in order to form collector layer 22, mask 10 is removed, ion implantation 18 of boron 19 is carried out over the whole of back surface 3 of wafer 1, and laser annealing 20 is carried out. By separating ion implantation 16 forming in-groove diffusion layers 21 and ion implantation 18 forming collector layer 22 in this way, it is possible to increase the impurity concentration of in-groove diffusion layers 21, and increase the reverse blocking capability of the reverse blocking IGBT. Also, by adjusting the concentration of collector layer 22 to an optimum value, it is possible to select an optimum value for the tradeoff between the turn-on voltage and switching loss of the reverse blocking IGBT. A process wherein ion implantations 16 and 18 are carried out at separate times in this way is extremely effective.

Also, when diagonal ion implantation 16a that implants impurities diagonally into back surface 3 of wafer 1 is used as the ion implantation into side wall surfaces 13 of grooves 12 shown in FIG. 3G, the direction of the ion implantation into side wall surfaces 13 of grooves 12, which are the implanted surfaces, nears the perpendicular. For this reason, it is possible to increase the implantation amount. In particular, diagonal ion implantation 16a is effective when overhang 15 formed in the resist of mask 10, which is formed when carrying out an alkaline etching, is large.

In Working Example 1, ion implantation 16 into side wall surfaces 13 of grooves 12 is carried out, reusing mask 10 used in the formation of grooves 12, after which mask 10 is removed, and ion implantation 18 is carried out over the whole of back surface 3, but the processing order can also be reversed, as in Working Example 2.

Working Example 2

Figure 9A:
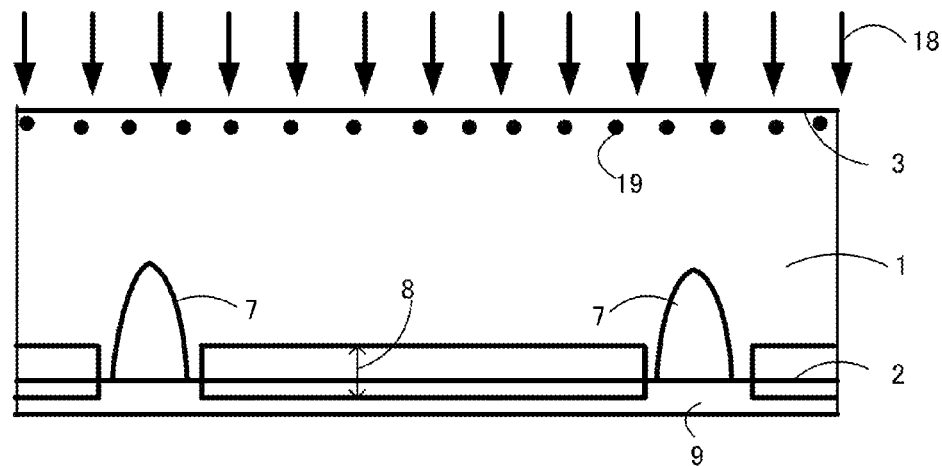
FIGS. 9A to 9C, showing a semiconductor device manufacturing method of a second working example of the invention, are main portion manufacturing step sectional views shown in order of step.
Figure 9B:
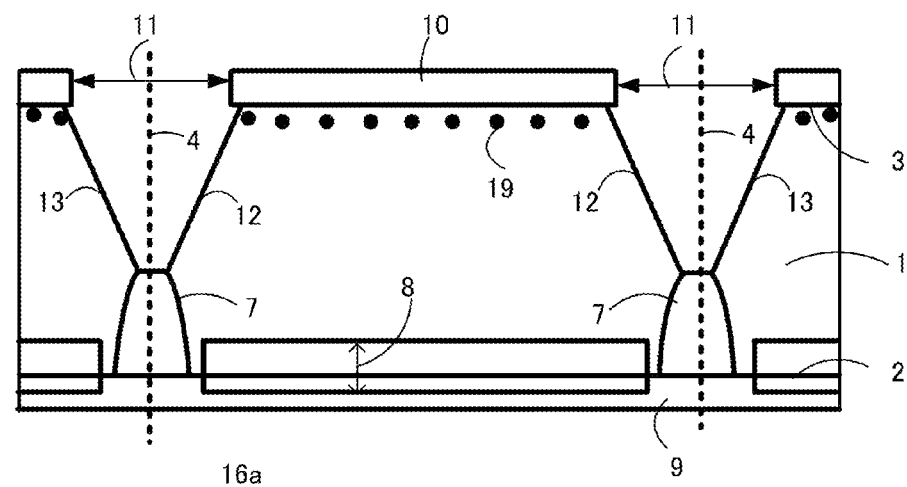
Figure 9C:
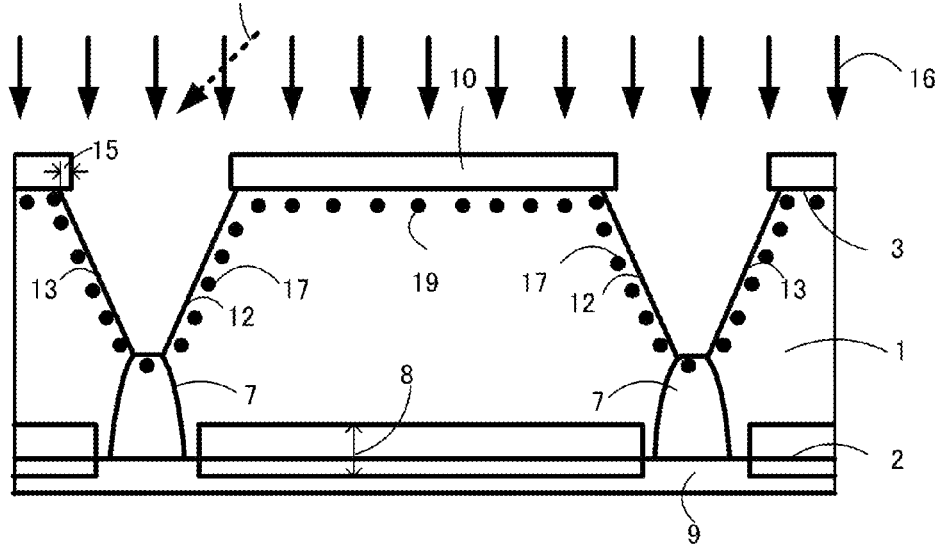

FIGS. 9A to 9C, showing a semiconductor device manufacturing method of a second working example of the invention, are main portion manufacturing step sectional views shown in order of step. A description will be given of points differing from Working Example 1. From FIG. 1A to FIG. 2D, manufacturing is carried out in the same steps as in Working Example 1.

In FIG. 9A, after the step of FIG. 2D, ion implantation 18 is carried out with an accelerating voltage of 80 keV and a dose of $1\times10^{14}$ $cm^{-2}$ in order to form collector layer 22. Ion implantation 18 is carried out at a tilt angle of 7° with respect to back surface 3. As conditions for ion implantation 18, it is preferable that it is carried out over the whole of back surface 3 with ranges of boron 19 of 40 keV to 150 keV for the accelerating voltage and $1\times10^{13}$ $cm^{-2}$ to $1\times10^{15}$ $cm^{-2}$ for the dose.

Next, in FIG. 9B, a resist is applied over the whole of the back surface 3. Continuing, using a double-sided exposure device, an alignment of the front and back surfaces is carried out, and the resist is opened in places corresponding to dicing lines 26, forming mask 10. Using mask 10, tapered grooves 12 are formed using an alkaline etching. The alignment of the front and back surfaces is carried out by matching central lines 4 of apertures 6 of mask 5 used in the formation of thermal diffusion layers 7 of front surface 2 with central lines 4 of apertures 11 of the mask 10 used in the formation of grooves 12 of back surface 3.

Next, in FIG. 9C, using mask 10, ion implantation 16 of boron 17 is carried out inside grooves 12. The ion implantation conditions are an accelerating voltage of 60 keV to 180 keV and a dose of $5\times10^{13}$ $cm^{-2}$ to $5\times10^{15}$ $cm^{-2}$. In subsequent steps, in the same way as in Working Example 1, mask 10 is removed, and an annealing (laser annealing 20) activating boron 17 and 19 is carried out, forming back surface electrode 23. In this way too, it is possible to obtain a reverse blocking IGBT having a sufficient reverse blocking voltage. As there is a shadow below overhang 15 formed by the alkaline etching with ion implantation 16 into side wall surfaces 13 of grooves 12, diagonal ion implantation 16a is effective.

In Working Example 1 and Working Example 2, it is possible to considerably reduce the thermal diffusion time for forming thermal diffusion layers 7 by forming grooves 12 from back surface 3 of wafer 1. Also, as the impurity concentration of collector layer 22 and the impurity concentration of in-groove diffusion layers 21 are determined independently, it is possible to make each of them an optimum concentration.

However, as the direction of grooves 12 in Working Example 1 and Working Example 2 is the direction of the cleavage (a <110> direction), the strength of wafer 1 decreases, and it may happen that breakage or chipping occurs when handling. Also, as the (100) plane, which has few interface states, cannot be utilized as a trench surface in a trench gate device (for example, a trench gate reverse blocking IGBT), fabrication is not possible.

Next, a description will be given of a method whereby the strength of wafer 1 can be ensured, and a trench gate device can be fabricated.

Working Example 3

FIGS. 10A to 13J, showing a semiconductor device manufacturing method of a third working example of the invention, are main portion manufacturing step sectional views shown in order of step. This is an example of a reverse blocking IGBT having a trench gate structure.

Figure 10A:
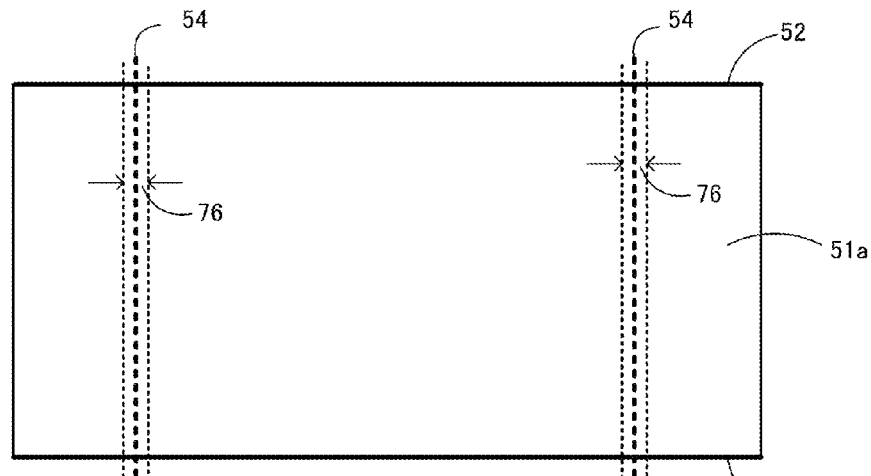
FIGS. 10A to 10C are main portion manufacturing step sectional views of a semiconductor device of a third working example of the invention.
Figure 14A:
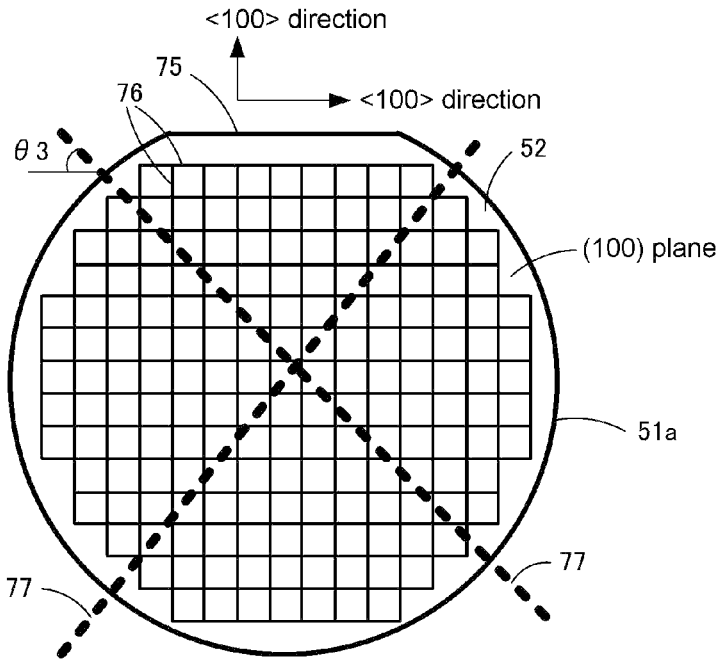
Figure 14B:
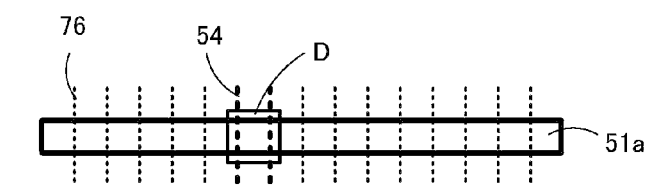
Figure 14C:
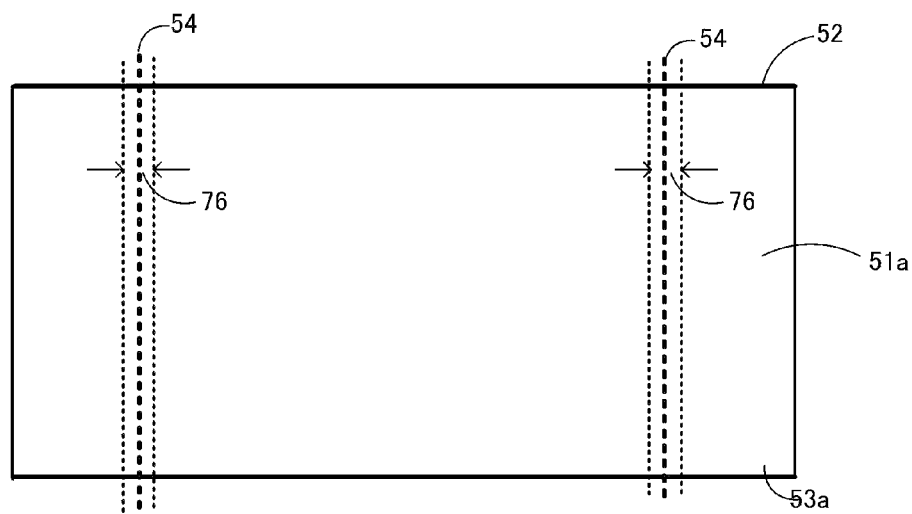

In FIG. 10A, wafer 51a with a thickness in the region of, for example, 400 μm, wherein the directions of OF 75 in the (100) plane are <100> directions, is prepared, as shown in FIGS. 14A to 14C. This crystal orientation is selected in order that, when making the gate structure of the IGBT a trench gate, it is possible to form the longitudinal direction of the trench perpendicular to or parallel to the directions of OF 75. By selecting these directions (orientation), it is possible to make the plane in which a channel is formed the (100) plane, which has few interface states. With the (100) plane, it is possible to increase the electron mobility, and it is possible to reduce the channel resistance. Also, as the directions of OF 75 coincide with the directions of dicing lines 76 when chips are removed from wafer 51a, the directions of dicing lines 76 are also the <100> directions. Also, with the (100) plane wafer 51a, all the plane orientations perpendicular to the directions perpendicular to or parallel to the <100> direction OF 75 are planes equivalent to the (100) plane. Also, the directions of the <100> direction dicing lines 76 intersect <110> direction cleavage directions 77 at 45° (θ3 of FIG. 14A). For this reason, wafer 51a is unlikely to break, and has a large mechanical strength. FIG. 14A is a plan view of the wafer of FIG. 10A, FIG. 14B is a sectional view of FIG. 14A, and FIG. 14C is an enlarged view of a D portion of FIG. 14B. Also, the step sectional views are sectional views corresponding to FIG. 14C.

Figure 10B:
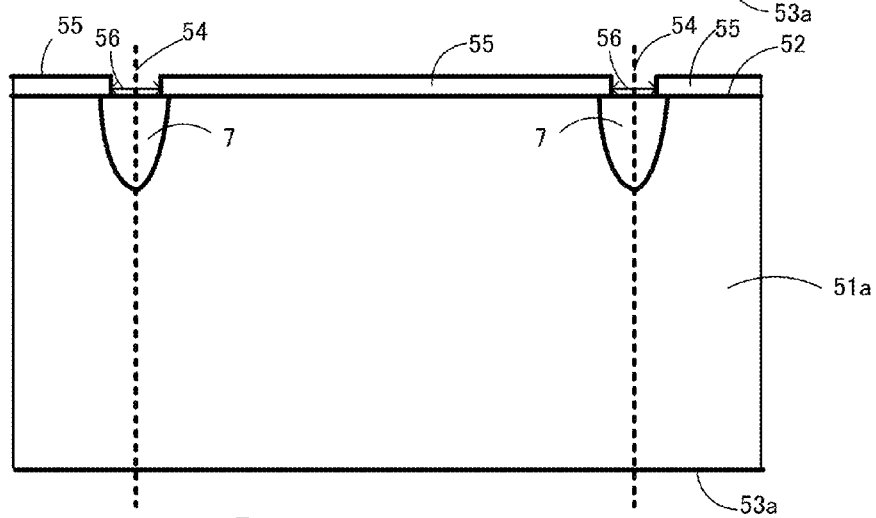

Next, as shown in FIG. 10B, apertures 56 are formed in such a way that central lines 54 of dicing lines 76 are central lines 54 of apertures 56. By so doing, apertures 56 are formed to an equal width on either side of central lines 54. Boron ions are implanted using mask 55 on which is formed a pattern having apertures 56. Subsequently, the boron is thermally diffused to a depth in the region of, for example, 85 μm, forming thermal diffusion layers 57 that become one portion of separation layers 80. The depth of thermal diffusion layers 57 is an example when blocking voltage is 1,200V, but the depth changes according to the device blocking voltage. The diffusion depth of the boron is the thickness (wafer thickness) of silicon in a residual film when forming grooves 62 with an alkaline etching in a subsequent step. The thickness of the residual film is made equal to or greater than a thickness that can be handled without the wafer breaking. The thickness of the residual film that can be handled is 50 μm or more in a wafer of a size of 6 inches or more. For this reason, the diffusion depth of the boron is 50 μm or more. Also, an oxide film or a resist is used as mask 55 when implanting the ions. As the oxide film, for example, a CVD film may be used. As cleavage directions 27 and groove 12 directions of wafer 1a are the same in FIG. 5A, the strength of wafer 1a is reduced by etching grooves 12. Meanwhile, as the angle θ3 at which cleavage directions 77 and groove 62 directions (the dicing line directions) intersect in FIG. 14A is 45°, the strength of wafer 51a is ensured.

Figure 10C:
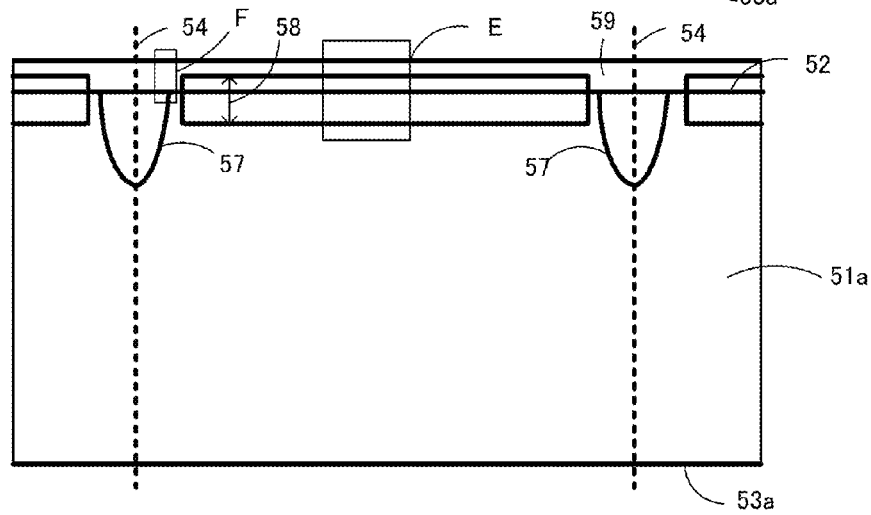
Figure 15A:
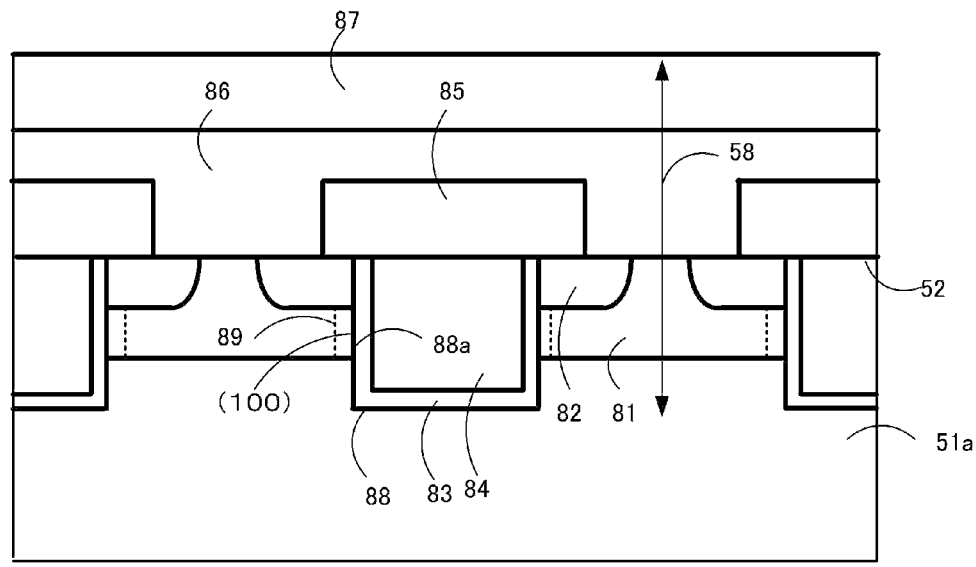
Figure 15B:
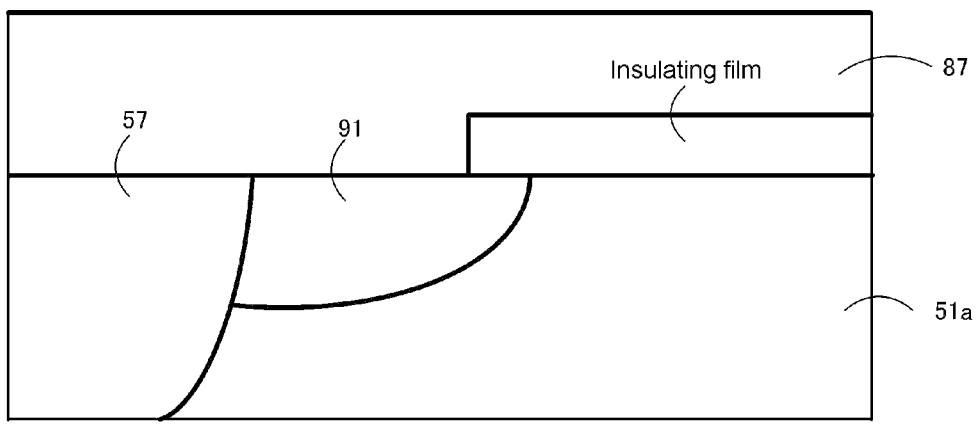
Figure 15C:
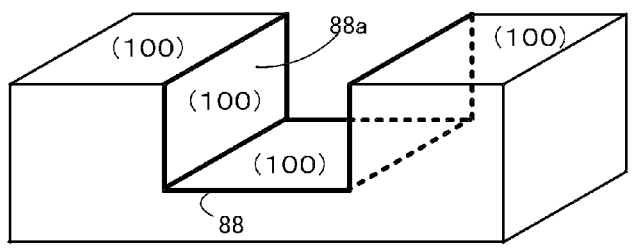

Next, in FIG. 10C, mask 55 is removed, trench gate type IGBT device surface structure 58 is formed, and resist 59 is applied on surface structure 58. As shown in FIG. 15A, surface structure 58 is configured of p-well layer 81, n-emitter layer 82, gate insulating film 83 formed in trench 88, gate electrode 84 filling trench 88, interlayer insulating film 85, emitter electrode 86, and surface protecting film 87 of polyimide or the like. Also, a diffusion layer 91 configures one portion of a blocking voltage structure. FIG. 15A is a detailed view of an E portion of FIG. 10C, FIG. 15B is a detailed view of an F portion of FIG. 10C, and FIG. 15C is a perspective view of the trench. Also, surface protecting film 87 and diffusion layer 91 are not shown in FIG. 10C.

By OF 75 of wafer 51a being in the <100> directions, and by forming the longitudinal direction of trench 88 perpendicular to or parallel to these directions, side wall surface 88a of trench 88, which is the gate, is in the (100) plane. As shown in FIG. 15C, side wall surface 88a of trench 88, that is, the surface in which channel 89 is formed, is the (100) plane, which has few interface states, meaning that it is possible to increase the mobility of the electrons moving in channel 89. As a result of this, it is possible to reduce the channel resistance, and it is possible to reduce the turn-on voltage of the reverse blocking IGBT.

Figure 11D:
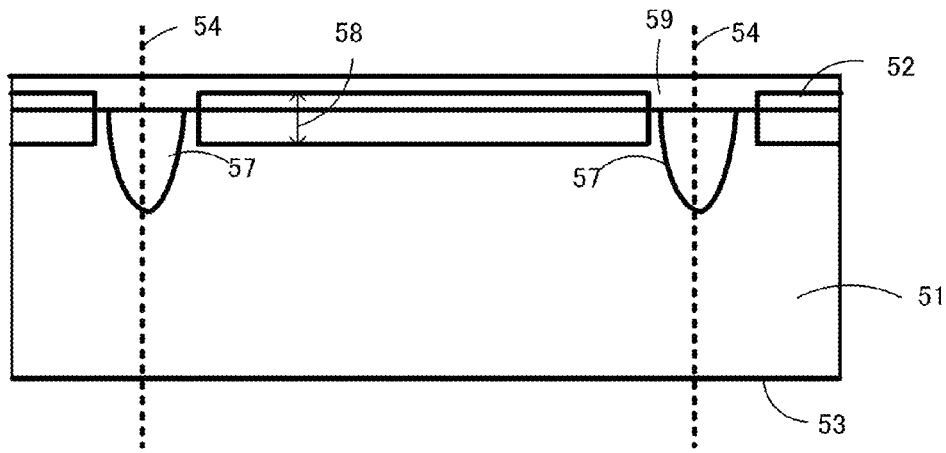
FIGS. 11D to 11F, continuing from FIGS. 10A to 10C, are main portion manufacturing step sectional views of the semiconductor device of the third working example.

Next, in FIG. 11D, the thickness of wafer 51a is reduced (the wafer is thinned) by grinding back surface 53a of wafer 51a and etching it with a mixed acid, completing wafer 51 with smooth back surface 53. By etching with the mixed acid, processing strain of back surface 53 occurring during the back grinding is removed. As the reverse blocking IGBT is an NPT type IGBT, the thickness of wafer 51 is approximately 200 μm, a thickness whereby it is possible to respond to a blocking voltage of, for example, 1,200V. Of course, in the event that the device blocking voltage differs, the thickness changes.

Figure 11E:
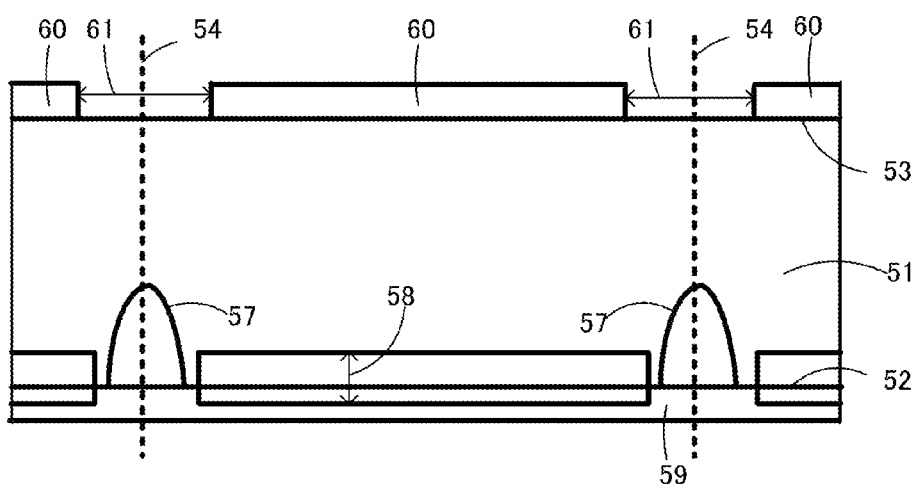

Next, in FIG. 11E, a resist is applied with back surface 53 of wafer 51 facing upward. Continuing, using a double-sided exposure device, the pattern (apertures 56 of mask 55) of front surface 52 in which are formed thermal diffusion layers 57 is transferred to back surface 53 in such a way that the patterns are aligned. The pattern transferred to back surface 53 is a pattern that is a projection of the pattern of front surface 52. The resist is patterned with the projected pattern of the back surface 53, forming mask 60 in which are formed apertures 61. Central lines 54 of apertures 56 for forming thermal diffusion layers 57 and central lines 54 of apertures 61 formed in back surface 53 coincide. Apertures 61 are formed to an equal width on either side of central lines 54. Also, central lines 54 of apertures 56 forming thermal diffusion layers 57 and central lines 54 of dicing lines 76 coincide. That is, central lines 54 shown in the drawings are the central lines of each of dicing lines 76, apertures 56, and apertures 61.

Figure 11F:
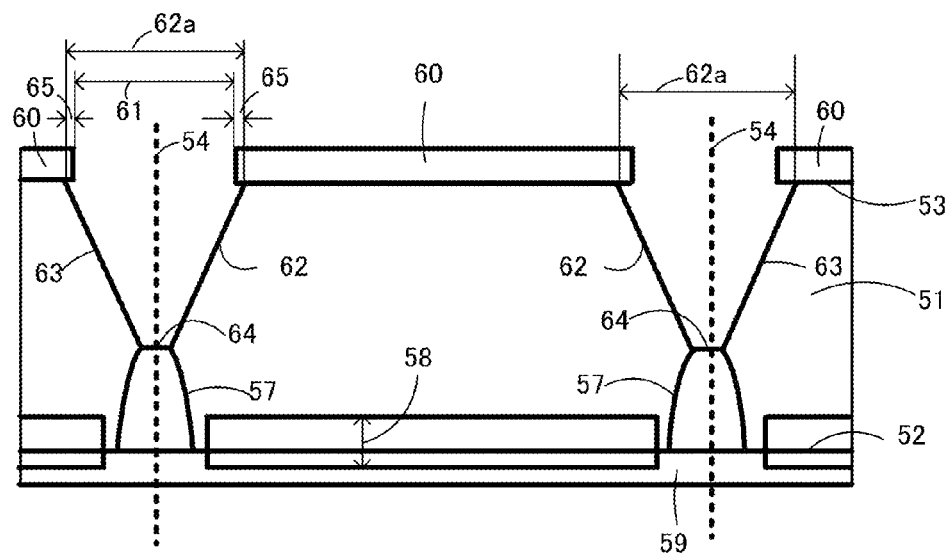
Figure 16:
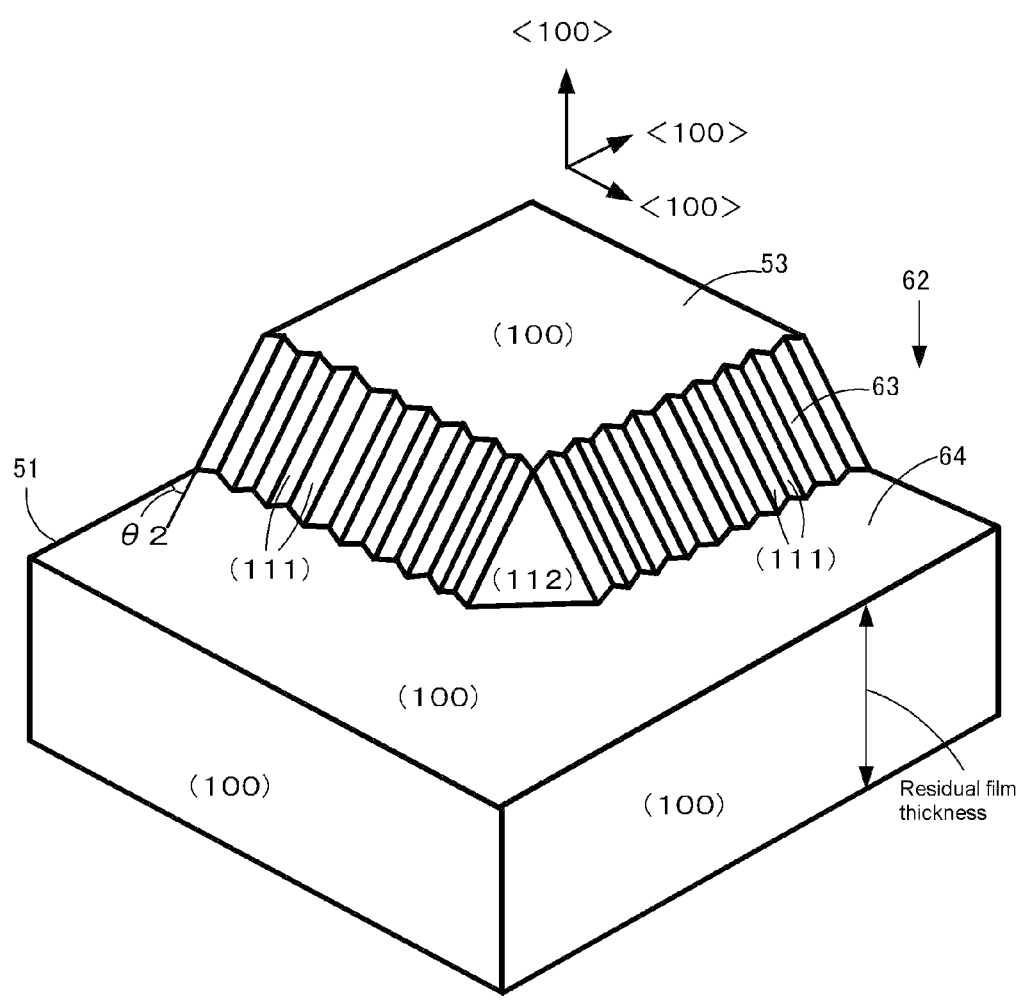
FIG. 16 is a main portion perspective view of a wafer 51 in which is formed a tapered groove 62.

Next, in FIG. 11F, using mask 60, tapered grooves 62 are formed in wafer 51 by carrying out an anisotropic etching with an alkaline solution. The etching is carried out with a solution temperature of 85° C. using, for example, a 10% TMAH aqueous solution as the alkaline etching solution. With the alkaline etching, tapered grooves 62 with the (111) plane as an etch stop plane are normally obtained. Owing to the relationship between the plane orientation of wafer 51 and the orientation of the etching mask, a taper angle θ2 of side wall surfaces 63 of grooves 62 herein is in the region of approximately 47° to 52°. Also, aperture widths 62a of grooves 62 are greater than the widths of apertures 61 of mask 60 due to side etching. For this reason, overhang 65 of mask 60 forms over aperture widths 62a of grooves 62. Also, as shown in FIG. 16, side wall surfaces 63 of grooves 62 are formed in such a way that the (111) planes intersect, and minute irregularities of a micrometer order of magnitude occur in side wall surfaces 63 of grooves 62. For this reason, it is necessary to make the accelerating voltage when ion implanting a certain amount larger than in Working Example 1.

Figure 12G:
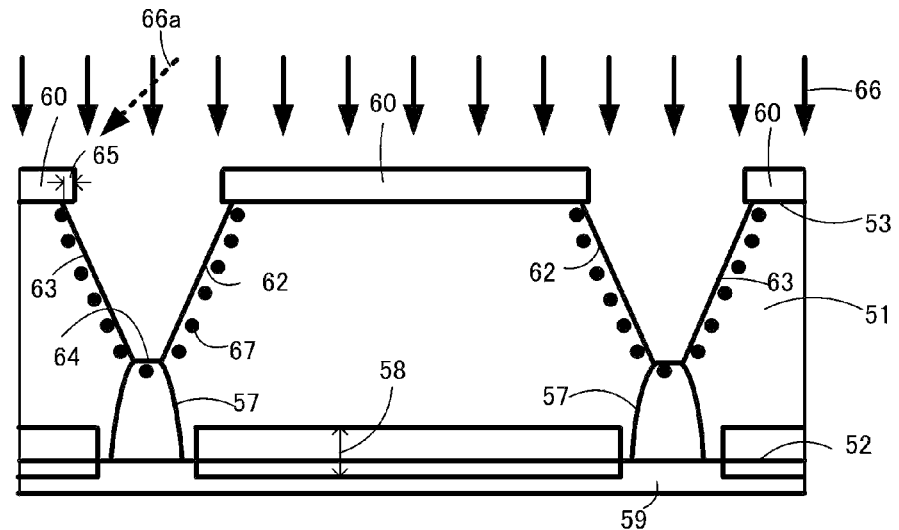
FIGS. 12G to 12I, continuing from FIGS. 11D to 11F, are main portion manufacturing step sectional views of the semiconductor device of the third working example.

Next, in FIG. 12G, in order to form in-groove diffusion layers 71, ion implantation 66 of boron 67 is carried out with an accelerating voltage of 150 keV and a dose of $5 \times 10^{14}$ cm$^{-2}$ into side wall surfaces 63 of grooves 62 using mask 60. Ion implantation 66 is carried out perpendicularly with respect to back surface 53. It is better to use a diagonal ion implantation. As it is possible to control the range of the ion implantation, defect recovery in a subsequent annealing step is easy. As conditions for ion implantation 66, ranges of 80 keV to 200 keV for the accelerating voltage and $5 \times 10^{13}$ cm$^{-2}$ to $5 \times 10^{15}$ cm$^{-2}$ for the dose are best. With an accelerating voltage of less than 80 keV, the implantation is too shallow. Meanwhile, when the accelerating voltage exceeds 200 keV, the damage suffered by side wall surfaces 63 of grooves 62 is large, and it is difficult for the crystallinity to recover in an annealing process. Also, with a dose of less than $5 \times 10^{13}$ cm$^{-2}$, the impurity concentration of in-groove diffusion layers 71 formed in side wall surfaces 63 of grooves 62 is too low, and it is difficult to ensure blocking voltage. Meanwhile, when the dose exceeds $5 \times 10^{15}$ cm$^{-2}$, the ion implantation time increases, and it is difficult for the crystallinity to recover in the annealing process due to the surface implanted becoming rough, meaning that the reverse leakage current increases. Consequently, it is advisable from the point of view of the device blocking voltage that the optimum values of the accelerating voltage and dose are fixed within the aforementioned ranges.

In this step, it is possible to selectively carry out ion implantation 66 in grooves 62 only. The dose and implantation depth of boron 67 ion implanted in side wall surfaces 63 of tapered grooves 62 are each reduced in comparison with those of the boron ion implanted into a flat surface perpendicular to the ion implantation direction. However, by ion implanting with a high accelerating voltage, it is possible to ion implant boron 67 with a sufficient dose and to a sufficient implantation depth even when side wall surfaces 63 of grooves 62 are diagonal and have irregularities. As irregularities form in side wall surfaces 63 of grooves 62, the accelerating voltage of ion implantation 66 is somewhat higher than in Working Example 1.

Figure 12H:
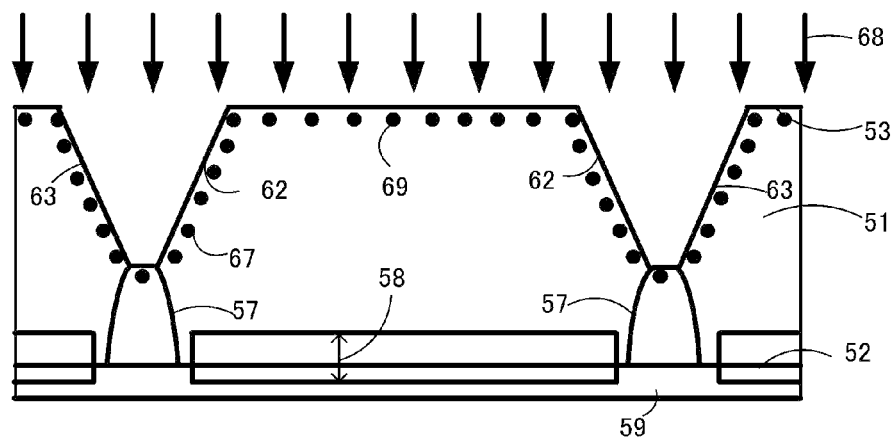

Next, in FIG. 12H, mask 60 is ashed and removed, and back surface 53 of wafer 51 is cleaned. Continuing, ion implantation 68 of boron 69 is carried out with an accelerating voltage of 80 keV and a dose of $1\times10^{14}$ cm$^{-2}$ over the whole of back surface 53 of wafer 51 in order to form collector layer 72. Ion implantation 68 is carried out at a tilt angle of 7° with respect to back surface 53. As conditions for carrying out ion implantation 68, ranges of 40 keV to 150 keV for the accelerating voltage and $1\times10^{13}$ cm$^{-2}$ to $1\times10^{15}$ cm$^{-2}$ for the dose are best. With an accelerating voltage of less than 40 keV, the implantation is too shallow. Meanwhile, when the accelerating voltage exceeds 150 keV, the damage to the surface implanted is large, and it may happen that it does not recover by annealing. Also, with a dose of less than $1\times10^{13}$ cm$^{-2}$, the implantation of holes from collector layer 72 to drift layer 74 is reduced, and the turn-on voltage increases. Meanwhile, when the dose exceeds $1\times10^{15}$ cm$^{-2}$, the implantation of holes increases, and the switching loss increases. As a result of this, the tradeoff between the turn-on voltage and switching loss deteriorates when the aforementioned ranges are departed from. Consequently, it is advisable from the point of view of the tradeoff between the turn-on voltage and switching loss of the device that the accelerating voltage and dose are fixed within the aforementioned ranges.

Also, ion implantation 68 is carried out at the same time into collector layer 72 and side wall surfaces 63 of grooves 62, but the dose when previously carrying out the ion implantation 66 is the dominant dose.

Figure 12I:
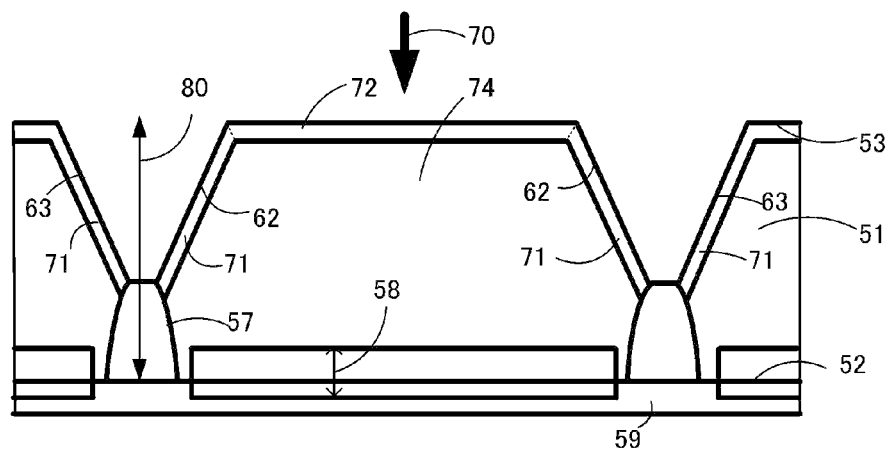

Next, in FIG. 12I, an annealing process is carried out in order to activate ion implanted boron 67 and 69, thus forming in-groove diffusion layers 71 and collector layer 72. Herein, the annealing process is carried out using laser annealing 70 wherein back surface 53 of wafer 51 is scanned and irradiated with a laser beam. However, an annealing process (not shown) in a furnace may be carried out instead. The annealing step also has the effect of causing crystal defects caused by the ion implantation to recover. As a condition of laser annealing 70 at this point, a laser power selected is such that boron 67 and 69 are activated, and the crystal defects caused by the ion implantations can recover sufficiently. Also, with the annealing process in the furnace, as a metal electrode (emitter electrode 86) is already formed in surface structure 58 of the reverse blocking IGBT, it is sufficient to choose a condition whereby boron 67 and 69 are activated at, for example, 400° C. or less.

Figure 13:
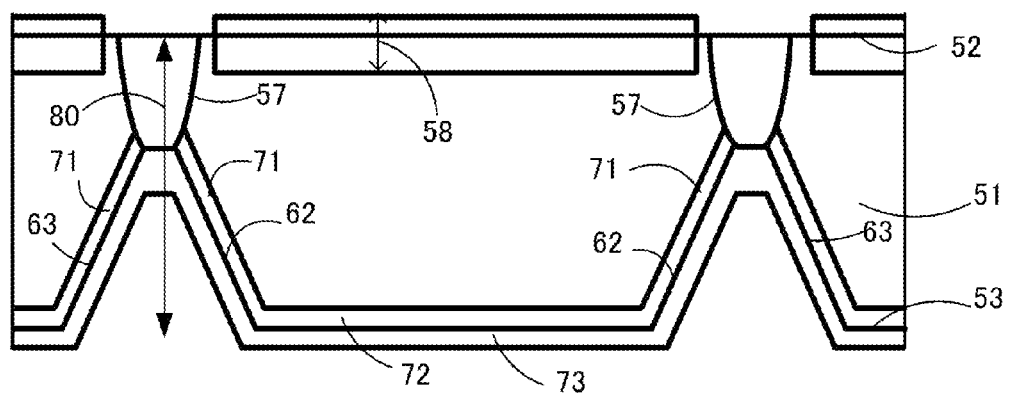
FIG. 13, continuing from FIGS. 12G to 12I, is a main portion manufacturing step sectional view of the semiconductor device of the third working example.

Next, in FIG. 13, resist 59 (the negative resist) of front surface 52 is removed using a stripping liquid. However, in the case of a furnace annealing, the resist is removed using a stripping liquid after ion implantation 68. Continuing, back surface 53 of wafer 51 is HF (hydrofluoric acid) cleaned, a natural oxide film is removed, and an unshown back surface electrode 73 (a collector electrode) is formed by sputtering. Subsequently, a metal annealing is carried out, wafer 51 is cut along dicing lines 76 located in separation layers 80, dividing wafer 51, and the reverse blocking IGBT is completed. FIG. 13 is drawn with surface structure 58 facing upward. Separation layers 80 are configured of thermal diffusion layers 57 formed by thermal diffusion from front surface 52, and in-groove diffusion layers 71, linked to thermal diffusion layers 57, formed by ion implantations 66 and 68 into side wall surfaces 63 of grooves 62 from back surface 53, and by laser annealing 70.

As heretofore described, when forming separation layers 80 of reverse blocking IGBT, grooves 62 are etched from back surface 53 side of wafer 51 with mask 60 as the mask. Continuing, ion implantation 66 of boron 67 for forming the high density in-groove diffusion layers 71 in side wall surfaces 63 of grooves 62 is carried out with mask 60 as the mask. Subsequently, in order to form collector layer 72, resist 60 is removed, and ion implantation 68 of boron 69 is carried out over the whole of back surface 53 of wafer 51. Continuing, separation layers 80 configured of thermal diffusion layers 57 and in-groove diffusion layers 71 are formed by carrying out laser annealing 70. By separating ion implantation 66 forming in-groove diffusion layers 71 and ion implantation 68 forming collector layer 72, it is possible to increase the impurity concentration of in-groove diffusion layers 71, and ensure the reverse blocking capability of the reverse blocking IGBT. Also, by adjusting the concentration of collector layer 72 to an optimum value, it is possible to select an optimum value for the tradeoff between the turn-on voltage and switching loss of the reverse blocking IGBT. A process wherein ion implantations 66 and 68 are carried out at separate times in this way is extremely effective.

Also, even though side wall surfaces 63 of grooves 62 are irregular, an impurity layer of a sufficiently high concentration is formed in side wall surfaces 63 of grooves 62 by raising the accelerating voltage of ion implantation 66. As a result of this, it is possible to increase the reverse blocking capability of the reverse blocking IGBT.

Also, when diagonal ion implantation 66a is used as the ion implantation into side wall surfaces 63 of grooves 62, the direction of the ion implantation with respect to the implanted surfaces nears the perpendicular, meaning that it is possible to increase the implantation amount. In particular, the diagonal ion implantation 66a is effective when overhang 65 formed in the resist of mask 60 when carrying out an alkaline etching is large.

Also, by making the plane orientations of wafer 51 the (100) plane, and having OF 75 in the <100> directions, it is possible to make a trench gate, and it is possible to improve the performance of the reverse blocking IGBT.

Furthermore, by having OF 75 in the <100> directions, it is possible to increase the mechanical strength of wafer 51, and it is possible to prevent breakage and chipping when handling.

In Working Example 3, ion implantation 66 into side wall surfaces 63 of grooves 62 is carried out, reusing mask 60 used in the formation of grooves 62, after which mask 60 is removed, and ion implantation 68 is carried out over the whole of back surface 53, but the processing order can also be reversed, as in Working Example 4.

Working Example 4

Figure 17A:
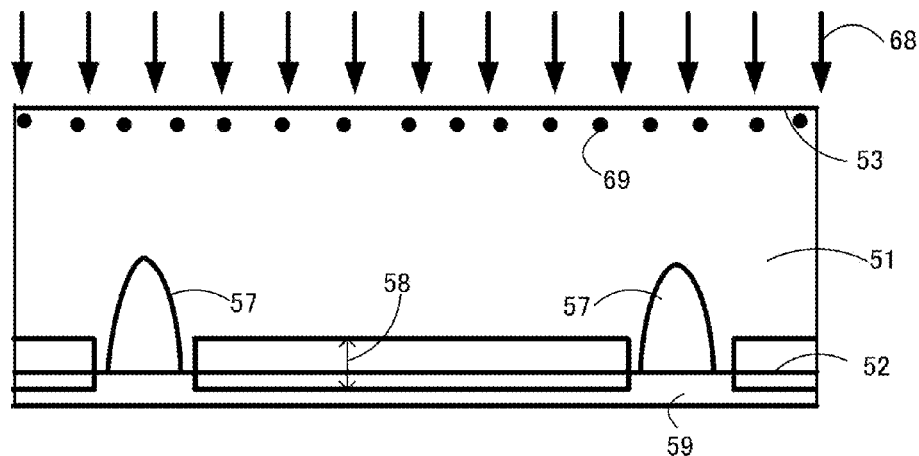
FIGS. 17A to 17C, showing semiconductor device manufacturing steps of a fourth working example of the invention, are main portion manufacturing step sectional views shown in order of step.
Figure 17B:
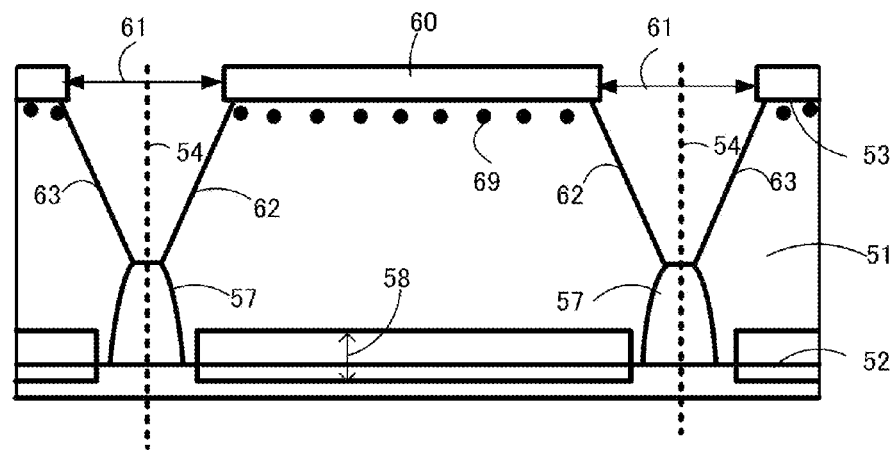
Figure 17C:
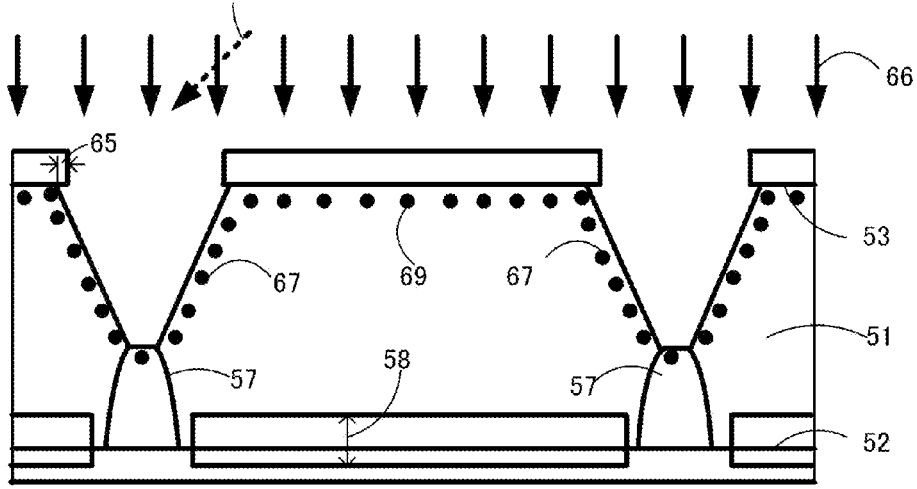
Figure 18A:
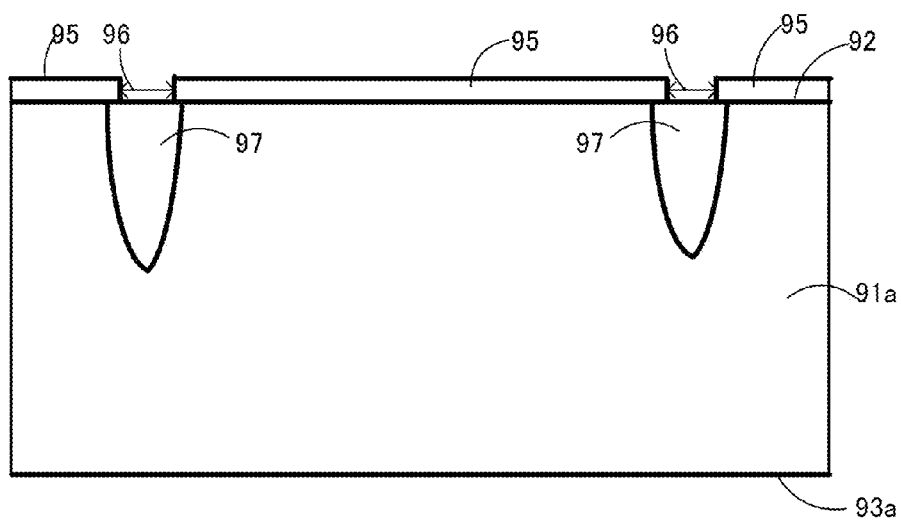
FIGS. 18A to 18C, showing a heretofore known reverse blocking IGBT manufacturing method, are main portion manufacturing step sectional views shown in order of step.
Figure 18B:
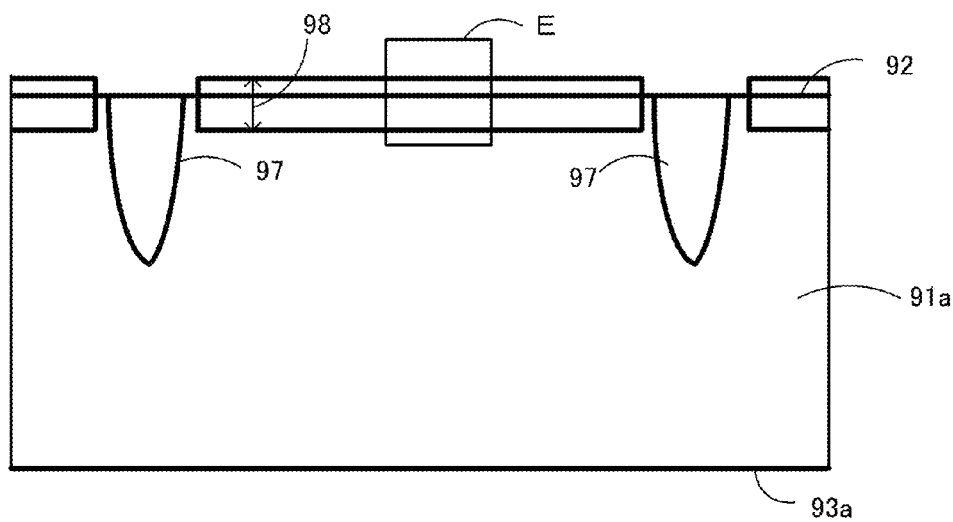
Figure 18C:
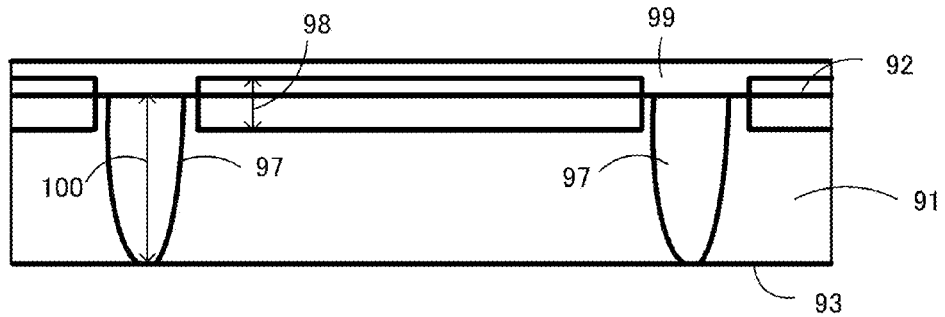
Figure 19:
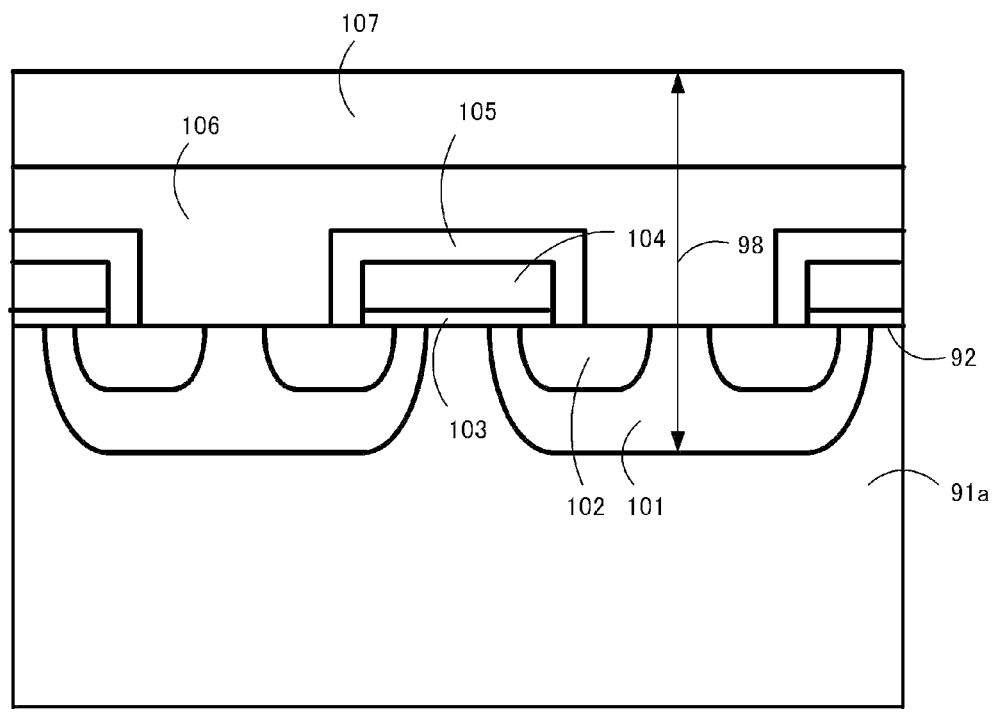
FIG. 19 is a detailed view of an E portion of FIG. 18B.

FIGS. 17A to 17C, showing semiconductor device manufacturing steps of a fourth working example of the invention, are main portion manufacturing step sectional views shown in order of step. A description will be given of points differing from Working Example 3. From FIG. 10A to FIG. 11D, manufacturing is carried out in the same steps as in Working Example 3.

In FIG. 17A, after the step of FIG. 11D, ion implantation 68 is carried out with an accelerating voltage of 80 keV and a dose of $1\times10^{14}$ cm$^{-2}$ in order to form collector layer 72. Ion implantation 68 is carried out at a tilt angle of 7° with respect to back surface 53. As conditions for the ion implantation 68, it is preferable that it is carried out over the whole of back surface 53 with ranges of 40 keV to 150 keV for the accelerating voltage and $1\times10^{13}$ cm$^{-2}$ to $1\times10^{15}$ cm$^{-2}$ for the dose.

Next, in FIG. 17B, a resist is applied over the whole of back surface 53. Continuing, an alignment of the front and back surfaces is carried out, and the resist is opened in places corresponding to dicing lines 76, forming mask 60. Using mask 60, tapered grooves 62 are formed using an alkaline etching. The alignment of the front and back surfaces is carried out, using a double-sided exposure device, by matching central lines 54 of apertures 56 of mask 55 used in the formation of thermal diffusion layers 57 of front surface 52 with central lines 54 of apertures 61 of mask 60 used in the formation of grooves 62 of back surface 53.

Next, in FIG. 17C, using mask 60, ion implantation 66 of boron 67 is carried out inside grooves 62 with an accelerating voltage of 150 keV and a dose of $5\times10^{14}$ cm$^{-2}$. Ion implantation 66 is carried out perpendicularly to back surface 53. It is better to use a diagonal ion implantation. As it is possible to control the range of the ion implantation, defect recovery in a subsequent annealing step is easy. As conditions for ion implantation 66, ranges of 80 keV to 200 keV for the accelerating voltage and $5\times10^{13}$ cm$^{-2}$ to $5\times10^{15}$ cm$^{-2}$ for the dose are best. In subsequent steps, in the same way as in Working Example 3, the mask 60 is removed, and an annealing (the laser annealing 70) activating boron 67 and 69 is carried out, forming back surface electrode 73. In this way too, it is possible to obtain a reverse blocking IGBT having a sufficient reverse blocking voltage. As there is a shadow below overhang 65 formed by the alkaline etching with ion implantation 66 into side wall surfaces 63 of grooves 62, diagonal ion implantation 66a is effective. In this way, it is possible to obtain a reverse blocking IGBT having a sufficient reverse blocking voltage.

In Working Example 1 and Working Example 3, as ion implantations 18 and 68 are carried out over the whole of back surfaces 3 and 53, ion implantations 18 and 68 are carried out over the whole of back surfaces 3 and 53 even when overhangs 15 and 65 of masks 10 and 60 are present. For this reason, in-groove diffusion layers 21 and 71 and collector layers 22 and 72 are formed linked together. Meanwhile, with Working Example 2 and Working Example 4, as grooves are formed in masks 10 and 60 after ion implantations 18 and 68 are carried out over the whole of back surfaces 3 and 53, and ion implantations 16 and 66 are carried out into grooves 12 and 62 using masks 10 and 60, there is a danger that places where ion implantations 16 and 66 are not carried out occur in the upper end portions of side wall surfaces 13 and 63 of grooves 12 and 62 below overhangs 15 and 65. Because of this, in-groove diffusion layers 21 and 71 and collector layers 22 and 72 cease to be linked together, and a reduction in blocking voltage is caused in these places. For this reason, the manufacturing methods of Working Example 1 and Working Example 3 are preferable to the manufacturing methods of Working Example 2 and Working Example 4.

Thus, a manufacturing method of a semiconductor device has been described according to the present invention. Many modifications and variations may be made to the techniques and structures described and illustrated herein without departing from the spirit and scope of the invention. Accordingly, it should be understood that the methods described herein are illustrative only and are not limiting upon the scope of the invention.

This application is based on, and claims priority to, Japanese Patent Application 2010-112829, filed on May 17, 2010. The disclosure of the priority application in its entirety, including the drawings, claims, and the specification thereof, is incorporated herein by reference.

What is claimed is:

1. A semiconductor device manufacturing method, comprising:
   a step of, in a first conductivity type silicon wafer wherein the plane orientation of a first main surface is the (100) plane, using a first mask opened by an equal amount on either side of a first central line in places which are to be <110> direction dicing lines, forming a second conductivity type thermal diffusion layer from the first main surface side toward the interior of the silicon wafer;
   a step of reducing the thickness of the silicon wafer from a second main surface side;
   a step of forming a second mask opened by an equal amount on either side of a second central line, which is a projection of the first central line on a second main surface of the silicon wafer reduced in thickness, on the second main surface;
   a step of forming a groove reaching the thermal diffusion layer from the second main surface, using the second mask, by an anisotropic etching with an alkaline solution;
   a step of carrying out a first ion implantation with a second conductivity type impurity into side wall surfaces of the groove using the second mask;
   a step of removing the second mask, and carrying out a second ion implantation with the second conductivity type impurity into the second main surface and the side wall surfaces of the groove; and
   a step of carrying out an annealing process for activating the impurity introduced by the first ion implantation and second ion implantation, and forming an in-groove diffusion layer and a collector layer.

2. A semiconductor device manufacturing method, comprising:
   a step of, in a first conductivity type silicon wafer wherein the plane orientation of a first main surface is the (100) plane, using a first mask opened by an equal amount on either side of a first central line in places which are to be <110> direction dicing lines, forming a second conductivity type thermal diffusion layer from the first main surface side toward the interior of the silicon wafer;
   a step of reducing the thickness of the silicon wafer from a second main surface side;
   a step of carrying out a first ion implantation with a second conductivity type impurity into the second main surface of the silicon wafer reduced in thickness;
   a step of forming a second mask opened by an equal amount on either side of a second central line, which is a projection of the first central line on the second main surface, on the second main surface;
   a step of forming a groove reaching the thermal diffusion layer from the second main surface, using the second mask, by an anisotropic etching with an alkaline solution;
   a step of carrying out a second ion implantation with the second conductivity type impurity into side wall surfaces of the groove using the second mask; and a step of carrying out an annealing process for activating the impurity introduced by the first ion implantation and second ion implantation, and forming an in-groove diffusion layer and a collector layer.

3. A semiconductor device manufacturing method, comprising:
- a step of, in a first conductivity type silicon wafer wherein the plane orientation of a first main surface is the (100) plane, using a first mask opened by an equal amount on either side of a first central line in places which are to be <100> direction dicing lines, forming a second conductivity type thermal diffusion layer from the first main surface side toward the interior of the silicon wafer;
- a step of reducing the thickness of the silicon wafer from a second main surface side;
- a step of projecting the first central line onto a second main surface of the silicon wafer reduced in thickness, and forming a second mask opened by an equal amount on either side of a projected second central line on the second main surface;
- a step of forming a groove reaching the thermal diffusion layer from the second main surface, using the second mask, by an anisotropic etching with an alkaline solution;
- a step of carrying out a first ion implantation with a second conductivity type impurity into side wall surfaces of the groove using the second mask;
- a step of removing the second mask, and carrying out a second ion implantation with the second conductivity type impurity into the second main surface and the side wall surfaces of the groove; and
- a step of carrying out an annealing process for activating the impurity introduced by the first ion implantation and second ion implantation, and forming an in-groove diffusion layer and a collector layer.

4. A semiconductor device manufacturing method, comprising:
- a step of, in a first conductivity type silicon wafer wherein the plane orientation of a first main surface is the (100) plane, using a first mask opened by an equal amount on either side of a first central line in places which are to be <100> direction dicing lines, forming a second conductivity type thermal diffusion layer from the first main surface side toward the interior of the silicon wafer;
- a step of reducing the thickness of the silicon wafer from a second main surface side;
- a step of carrying out a first ion implantation with a second conductivity type impurity into the second main surface of the silicon wafer reduced in thickness;
- a step of forming a second mask opened by an equal amount on either side of a second central line, which is a projection of the first central line on the second main surface, on the second main surface;
- a step of forming a groove reaching the thermal diffusion layer from the second main surface, using the second mask, by an anisotropic etching with an alkaline solution;
- a step of carrying out a second ion implantation with the second conductivity type impurity into side wall surfaces of the groove using the second mask; and
- a step of carrying out an annealing process for activating the impurity introduced by the first ion implantation and second ion implantation, and forming an in-groove diffusion layer and a collector layer.

5. The semiconductor device manufacturing method according to claim 1, comprising:
- a step of, after forming the thermal diffusion layer, forming a second conductivity type well layer in a front side surface layer of a first conductivity type silicon substrate which is one portion of the silicon wafer surrounded by the places which are to be the dicing lines;
- a step of forming a first conductivity type emitter layer on a surface layer of the well layer;
- a step of forming a gate electrode across a gate insulating film over the well layer sandwiched between the silicon substrate and the emitter layer;
- a step of forming an interlayer insulating film across the top of the gate electrode and the top of the emitter layer;
- a step of forming an emitter electrode electrically connected to the emitter layer and well layer on the interlayer insulating film;
- a step of, after a surface structure is formed by a step including a step of forming a surface protecting film on the emitter electrode, forming the in-groove diffusion layer and the collector layer on a back surface of the silicon substrate;
- a step of forming a collector electrode across the top of the in-groove diffusion layer and the top of the collector layer; and
- a step of cutting and dividing the thermal diffusion layer along the places which are the dicing lines.

6. The semiconductor device manufacturing method according to claim 3, comprising:
- a step of, after forming the thermal diffusion layer, forming a second conductivity type well layer in a front side surface layer of a first conductivity type silicon substrate which is one portion of the silicon wafer surrounded by the places which are to be the dicing lines;
- a step of forming a trench from the front side of the silicon substrate penetrating the well layer and having an aperture whose longitudinal direction is parallel to the direction of the places which are to be the dicing lines;
- a step of forming a first conductivity type emitter layer in contact with side walls of the trench on the surface layer of the well layer;
- a step of forming a gate insulating film on inner walls of the trench, then forming a gate electrode in such a way as to fill the inside of the trench;
- a step of forming an interlayer insulating film across the top of the gate electrode and the top of the emitter layer;
- a step of forming an emitter electrode electrically connected to the emitter layer and well layer on the interlayer insulating film;
- a step of, after a surface structure is formed by a step including a step of forming a surface protecting film on the emitter electrode, forming the in-groove diffusion layer and the collector layer on a back surface of the silicon substrate;
- a step of forming a collector electrode across the top of the in-groove diffusion layer and the top of the collector layer; and
- a step of cutting and dividing the thermal diffusion layer along the places which are the dicing lines.

7. The semiconductor device manufacturing method according to claim 1, wherein the accelerating voltage and dose of the first ion implantation are each larger than the accelerating voltage and dose of the second ion implantation.

8. The semiconductor device manufacturing method according to claim 2, wherein the accelerating voltage and dose of the second ion implantation are each larger than the accelerating voltage and dose of the first ion implantation.

9. The semiconductor device manufacturing method according to claim 1, wherein the first ion implantation is carried out with boron with an accelerating voltage of 60 keV to 180 keV and a dose of $5 \times 10^{13}$ cm$^{-2}$ to $5 \times 10^{15}$ cm$^{-2}$, and the second ion implantation is carried out with boron with an accelerating voltage of 40 keV to 150 keV and a dose of $1 \times 10^{13}$ cm$^{-2}$ to $1 \times 10^{15}$ cm$^{-2}$.

10. The semiconductor device manufacturing method according to claim 2, wherein the second ion implantation is carried out with boron with an accelerating voltage of 60 keV to 180 keV and a dose of $5 \times 10^{13}$ cm$^{-2}$ to $5 \times 10^{15}$ cm$^{-2}$, and the first ion implantation is carried out with boron with an accelerating voltage of 40 keV to 150 keV and a dose of $1 \times 10^{13}$ cm$^{-2}$ to $1 \times 10^{15}$ cm$^{-2}$.

11. The semiconductor device manufacturing method according to claim 3, wherein the first ion implantation is carried out with boron with an accelerating voltage of 80 keV to 200 keV and a dose of $5 \times 10^{13}$ cm$^{-2}$ to $5 \times 10^{15}$ cm$^{-2}$, and the second ion implantation is carried out with boron with an accelerating voltage of 40 keV to 150 keV and a dose of $1 \times 10^{13}$ cm$^{-2}$ to $1 \times 10^{15}$ cm$^{-2}$.

12. The semiconductor device manufacturing method according to claim 4, wherein the second ion implantation is carried out with boron with an accelerating voltage of 80 keV to 200 keV and a dose of $5 \times 10^{13}$ cm$^{-2}$ to $5 \times 10^{15}$ cm$^{-2}$, and the first ion implantation is carried out with boron with an accelerating voltage of 40 keV to 150 keV and a dose of $1 \times 10^{13}$ cm$^{-2}$ to $1 \times 10^{15}$ cm$^{-2}$.

13. The semiconductor device manufacturing method according to claim 1, wherein the annealing process is a laser annealing or a furnace annealing.

14. The semiconductor device manufacturing method according to claim 1, wherein the first ion implantation implants ions diagonally with respect to the second main surface.

15. The semiconductor device manufacturing method according to claim 2, wherein the second ion implantation implants ions diagonally with respect to the second main surface.

16. The semiconductor device manufacturing method according to claim 1, wherein a separation layer is configured of the thermal diffusion layer and the in-groove diffusion layer.

17. The semiconductor device manufacturing method according to claim 1, wherein in the step of forming the groove by an anisotropic etching with an alkaline solution, the aperture width of the groove is greater than the aperture width of the second mask.

18. The semiconductor device manufacturing method according to claim 2, comprising:
a step of, after forming the thermal diffusion layer, forming a second conductivity type well layer in a front side surface layer of a first conductivity type silicon substrate which is one portion of the silicon wafer surrounded by the places which are to be the dicing lines;
a step of forming a first conductivity type emitter layer on a surface layer of the well layer;
a step of forming a gate electrode across a gate insulating film over the well layer sandwiched between the silicon substrate and the emitter layer;
a step of forming an interlayer insulating film across the top of the gate electrode and the top of the emitter layer;
a step of forming an emitter electrode electrically connected to the emitter layer and well layer on the interlayer insulating film;
a step of, after a surface structure is formed by a step including a step of forming a surface protecting film on the emitter electrode, forming the in-groove diffusion layer and the collector layer on a back surface of the silicon substrate;
a step of forming a collector electrode across the top of the in-groove diffusion layer and the top of the collector layer; and
a step of cutting and dividing the thermal diffusion layer along the places which are the dicing lines.

19. The semiconductor device manufacturing method according to claim 4, comprising:
a step of, after forming the thermal diffusion layer, forming a second conductivity type well layer in a front side surface layer of a first conductivity type silicon substrate which is one portion of the silicon wafer surrounded by the places which are to be the dicing lines;
a step of forming a trench from the front side of the silicon substrate penetrating the well layer and having an aperture whose longitudinal direction is parallel to the direction of the places which are to be the dicing lines;
a step of forming a first conductivity type emitter layer in contact with side walls of the trench on the surface layer of the well layer;
a step of forming a gate insulating film on inner walls of the trench, then forming a gate electrode in such a way as to fill the inside of the trench;
a step of forming an interlayer insulating film across the top of the gate electrode and the top of the emitter layer;
a step of forming an emitter electrode electrically connected to the emitter layer and well layer on the interlayer insulating film;
a step of, after a surface structure is formed by a step including a step of forming a surface protecting film on the emitter electrode, forming the in-groove diffusion layer and the collector layer on a back surface of the silicon substrate;
a step of forming a collector electrode across the top of the in-groove diffusion layer and the top of the collector layer; and
a step of cutting and dividing the thermal diffusion layer along the places which are the dicing lines.

20. The semiconductor device manufacturing method according to claim 3, wherein the accelerating voltage and dose of the first ion implantation are each larger than the accelerating voltage and dose of the second ion implantation.

21. The semiconductor device manufacturing method according to claim 4, wherein the accelerating voltage and dose of the second ion implantation are each larger than the accelerating voltage and dose of the first ion implantation.

22. The semiconductor device manufacturing method according to claim 4, wherein the second ion implantation is carried out with boron with an accelerating voltage of 60 keV to 180 keV and a dose of $5 \times 10^{13}$ cm$^{-2}$ to $5 \times 10^{15}$ cm$^{-2}$, and the first ion implantation is carried out with boron with an accelerating voltage of 40 keV to 150 keV and a dose of $1 \times 10^{13}$ cm$^{-2}$ to $1 \times 10^{15}$ cm$^{-2}$.

23. The semiconductor device manufacturing method according to claim 3, wherein the first ion implantation implants ions diagonally with respect to the second main surface.

24. The semiconductor device manufacturing method according to claim 4, wherein the second ion implantation implants ions diagonally with respect to the second main surface.

* * * * *